(12) United States Patent
Basser et al.

(10) Patent No.: US 7,643,863 B2
(45) Date of Patent: Jan. 5, 2010

(54) DIFFUSION TENSOR AND Q-SPACE MRI SPECIMEN CHARACTERIZATION

(76) Inventors: Peter J. Basser, 3319 Q. St., NW., Washington, DC (US) 20007-2717; Yaniv Assaf, 6 Harav Maimon Street, Holon 58342 (IL)

( * ) Notice: Subject to any disclaimer, the term of this patent is extended or adjusted under 35 U.S.C. 154(b) by 905 days.

(21) Appl. No.: 10/888,917

(22) Filed: Jul. 8, 2004

(65) Prior Publication Data

US 2005/0007100 A1    Jan. 13, 2005

Related U.S. Application Data

(60) Provisional application No. 60/485,658, filed on Jul. 8, 2003, provisional application No. 60/571,064, filed on May 14, 2004.

(51) Int. Cl.
*A61B 5/055*    (2006.01)

(52) U.S. Cl. ........................... 600/410; 324/307

(58) Field of Classification Search ................ 600/410; 436/173; 324/300
See application file for complete search history.

(56) References Cited

U.S. PATENT DOCUMENTS

| | | | |
|---|---|---|---|
| 5,488,297 A * | 1/1996 | Nakada | 324/309 |
| 5,539,310 A | 7/1996 | Basser et al. | |
| 5,560,360 A * | 10/1996 | Filler et al. | 600/408 |
| 6,463,315 B1 * | 10/2002 | Klingberg et al. | 600/410 |
| 6,526,305 B1 * | 2/2003 | Mori | 600/410 |
| 6,529,763 B1 | 3/2003 | Cohen et al. | |
| 6,642,716 B1 * | 11/2003 | Hoogenraad et al. | 324/309 |
| 6,751,495 B2 | 6/2004 | Maier et al. | |

OTHER PUBLICATIONS

Basser et al., "Estimation of the Effective Self-Diffusion Tensor from the NMR Spin Echo," J. Magn. Reson. B 103:247-254 (1994).
Cheng et al., "Multiple Scattering by NMR," J. Am. Chem. Soc. 121:7935-7936 (1999).
Shrager et al., "When is a Gaussian displacement distribution adequate to describe water diffusion in tissues?" St. Malo, France, presented by ISMRM, pp. 21-25 (2002).
Nicholson et al., "Diffusion from an iontophoretic point source in the brain: role of tortuosity and volume fraction," Brain Res. 169:580-584 (1979).
Beaulieu, "The basis of anisotropic water diffusion in nervous system—a technical review," NMR Biomed. 15:435-455 (2002).

(Continued)

*Primary Examiner*—Brian Casler
*Assistant Examiner*—Jonathan G Cwern
(74) *Attorney, Agent, or Firm*—Klarquist Sparkman, LLP

(57) ABSTRACT

Magnetic resonance methods include modeling magnetic resonance signals obtained from specimens at low and high q-values to obtain parameters associated with specimen structure and orientation. In evaluation of brain white matter specimens, diffusion within axons can be modeled based on hindered diffusion parallel to an axis of the axon and restricted diffusion perpendicular to the axis. Diffusion exterior to axons can be modeled as hindered diffusion with differing diffusivities parallel to and perpendicular to the axis. Based on extracted parameters and associated model functions, specimen properties such as intra and extra-axonal principal diffusivities and the corresponding principal directions can be estimated.

42 Claims, 15 Drawing Sheets

OTHER PUBLICATIONS

Pierpaoli et al., "Toward a Quantitative Assessment of Diffusion Anisotropy," Magn. Reson. Med. 36:893-906 (1996).

Basser, "Testing for and Exploiting Microstructural Symmetry to Characterize Tissues via Diffusion Tensor MRI," in: Proc. 4th Annual Meeting of ISMRM, New York, (1996).

Le Bihan et al., "Molecular Diffusion and Nuclear Magnetic Resonance," in *Diffusion and Perfusion Magnetic Resonance Imaging*, p. 5-17 (New York: Raven Press 1995).

Moseley et al., "Diffusion-weighted MR Imaging of Anisotropic Water Diffusion in Cat Central Nervous System[1]," Radiology 176:439-445 (1990).

Boss et al., "Anisotropic Diffusion in Hydrated Vermiculite," J. Chem. Phys. 43:1068-1069 (1965).

Basser et al., "Microstructural and Physiological Features of Tissues Elucidated by Quantitative-Diffusion-Tensor MRI," J. Magn. Reson. B 111:209-219 (1996).

Pierpaoli et al., "Diffusion Tensor MR Imaging of the Human Brain," Radiology 201:637-648 (1996).

Basser et al., "Diffusion-tensor MRI: theory, experimental design and data analysis—a technical review," NMR Biomed. 15:456-467 (2002).

Stanisz et al., "An Analytical Model of Restricted Diffusion in Bovine Optic Nerve," Magn. Reson. 37:103-111 (1997).

Niendorf et al., "Biexponential Diffusion Attenuation in Various States of Brain Tissue: Implications for Diffusion-Weighted Imaging," Magn. Reson. Med. 36:847-857 (1996).

Assaf et al., "Displacement Imaging of Spinal Cord Using $q$-Space Diffusion-Weighted MRI," Magn. Reson. Med. 44:713-722 (2000).

Basser et al., "MR Diffusion Tensor Spectroscopy and Imaging," Biophys. J. 66:259-267 (1994).

Pajevic et al., "Color Schemes to Represent the Orientation of Anisotropic Tissues from Diffusion Tensor Data: Application to White Matter Fiber Tract Mapping in the Human Brain," Magn. Reson. Med. 42:526-540 (1999).

Assaf et al., "Non-Mono-Exponential Attenuation of Water and N-Acetyl Aspartate Signals Due to Diffusion in Brain Tissue," J. Magn. Reson. 131: 69-85 (1998).

Mulkern et al., "Multi-component apparent diffusion coefficients in human brain," NMR Biomed. 12:51-62 (1999).

Mulkern et al., "Multi-component Apparent Diffusion Coefficients in Human Brain: Relationship to Spin-Lattice Relaxation," Magn. Reson. 44:292-300 (2000).

Tuch et al., "High Angular Resolution Diffusion Imaging Reveals Intravoxel White Matter Fiber Heterogeneity," Magn. Reson. Med. 48:577-582 (2002).

Clark et al., "Water Diffusion Compartmentation and Anisotropy at High b Values in the Human Brain," Magn. Reson. Med. 44: 852-859 (2000).

King et al., "Localized q-Space Imaging of the Mouse Brain," Magn. Reson. Med. 38: 930-937 (1997).

Basser, "Relationships Between Diffusion Tensor and $q$-Space MRI," Magn. Reson. Med., 47:392-397 (2002).

Cory et al., "Measurement of Translational Displacement Probabilities by NMR: An Indicator of Compartmentation," Magn. Reson. Med. 14:435-444 (1990).

Assaf et al., "Changes in Axonal Morphology in Experimental Autoimmune Neuritis as Studied by High $b$-Value q-Space $^1$H and $^2$H DQF Diffusion Magnetic Resonance Spectroscopy," Magn. Reson. Med. 48:71-81 (2002).

Assaf et al., "High $b$ value $q$-space-analyzed diffusion MRI in vascular dementia: A preliminary study," J. Neurol. Sci. 235-239 (2002).

Assaf et al. "High $b$-Value $q$-Space Analyzed Diffusion-Weighted MRI: Application to Multiple Sclerosis," Magn. Reson. Med., 47:115-126 (2002).

Quirk et al., "Equilibrium Water Exchange Between the Intra- and Extracellular Spaces of Mammalian Brain," Magn. Reson. Med. 50:493-499 (2003).

Assaf et al., "Assignment of the Water Slow-Diffusing Component in the Central Nervous System Using q-Space Diffusion MRS: Implications for Fiber Tract Imaging," Magn. Reson. Med. 43:191-199 (2000).

Kärger et al., "Principles and Application of Self-Diffusion Measurements by Nuclear Magnetic Resonance," Waugh J., editor, *Advances in Magnetic Resonance* 12:1-89 (N.Y. Acad. Press, 1988).

Stejskal, "Use of Spin Echoes in a Pulsed Magnetic-Field Gradient to Study Anisotropic, Restricted Diffusion and Flow," J. Chem. Phys. 43:3597-3603 (1965).

Robertson, "Spin-Echo Decay of Spins Diffusing in a Bounded Region," Phys, Rev. 151:273-277 (1966).

Neuman, "Spin echo of spins diffusing in a bounded medium," J. Chem. Phys. 60:4508-4511 (1974).

Codd et al., "Spin Echo Analysis of Restricted Diffusion under Generalized Gradient Waveforms: Planar, Cylindrical, and Spherical Pores with Wall Relaxivity," J. Magn. Reson. 137:358-372 (1999).

van Gelderen et al., "Evaluation of Restricted Diffusion in Cylinders. Phosphocreatine in Rabbit Leg Muscle," J. Magn. Reson. B. 103:255-260 (1994).

Maier et al., "Normal Brain and Brain Tumor: Multicomponent Apparent Diffusion Coefficient Line Scan Imaging[1]," Radiology 219:842-849 (2001).

Kauppinen, "Monitoring cytotoxic tumour treatment response by diffusion magnetic resonance imaging and proton spectroscopy," NMR Biomed. 15:6-17 (2002).

Yablonskiy et al., "Quantative in vivo assessment of lung microstructure at the alveolar level with hyperpolarized [3]He diffusion MRI," PNAS 99:3111-3116 (2002).

Assaf et al., "New Modeling and Experimental Framework to Characterize Hindered and Restricted Water Diffusion in Brain Matter," J. Magn. Reson. 52:965-978 (2004).

* cited by examiner

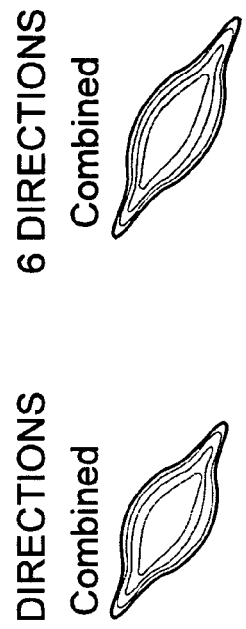
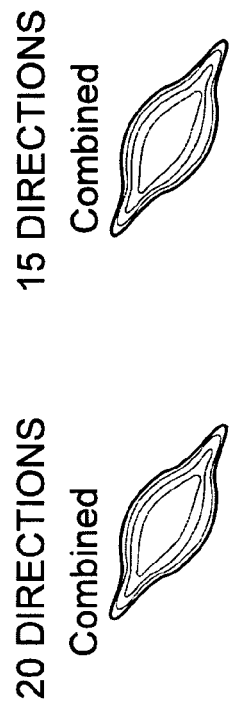
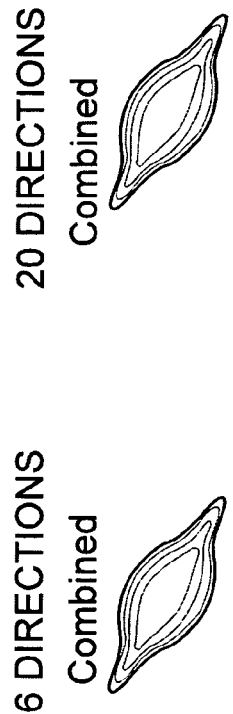
FIG. 11A  FIG. 11B  FIG. 11C  FIG. 11D
FIG. 12A  FIG. 12B  FIG. 12C  FIG. 12D
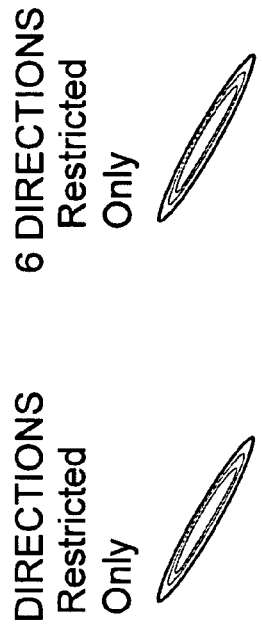
FIG. 13A  FIG. 13B  FIG. 13C  FIG. 13D

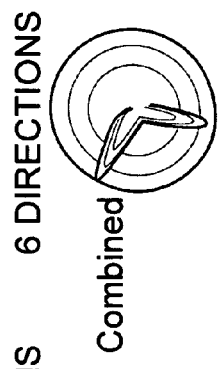   

FIG. 14A  36 DIRECTIONS Combined
FIG. 14B  20 DIRECTIONS Combined
FIG. 14C  15 DIRECTIONS Combined
FIG. 14D  6 DIRECTIONS Combined

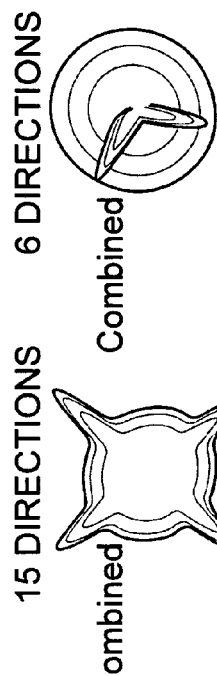 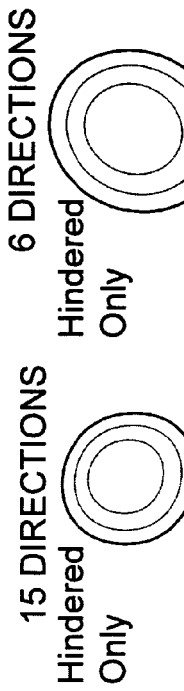  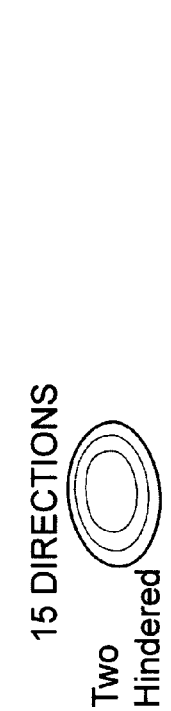

FIG. 15A  36 DIRECTIONS Hindered Only
FIG. 15B  20 DIRECTIONS Hindered Only
FIG. 15C  15 DIRECTIONS Hindered Only
FIG. 15D  6 DIRECTIONS Hindered Only

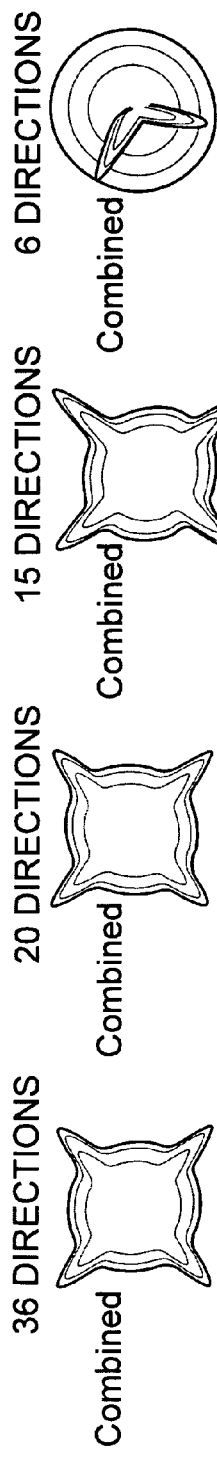 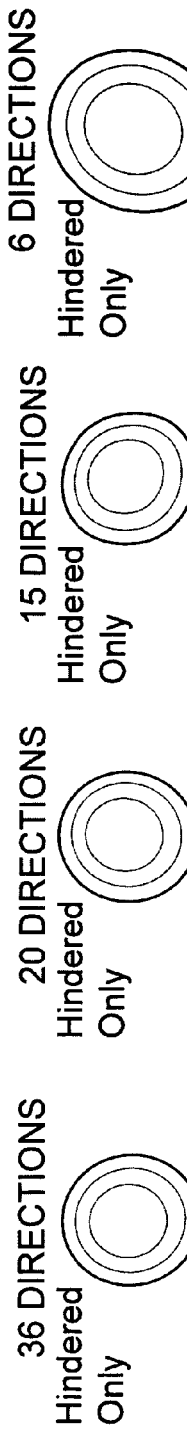 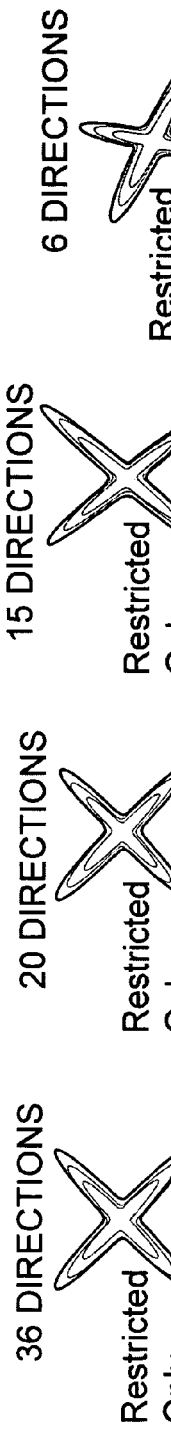 

FIG. 16A  36 DIRECTIONS Restricted Only
FIG. 16B  20 DIRECTIONS Restricted Only
FIG. 16C  15 DIRECTIONS Restricted Only
FIG. 16D  6 DIRECTIONS Restricted Only FIG. 17A  36 DIRECTIONS Two Hindered
FIG. 17B  20 DIRECTIONS Two Hindered
FIG. 17C  15 DIRECTIONS Two Hindered

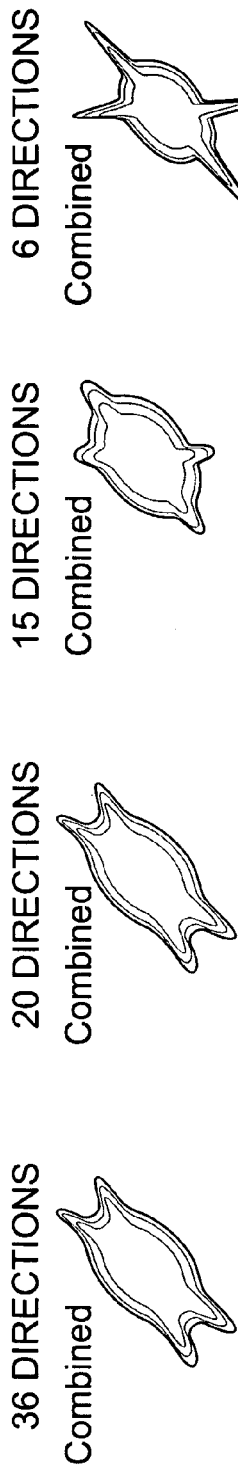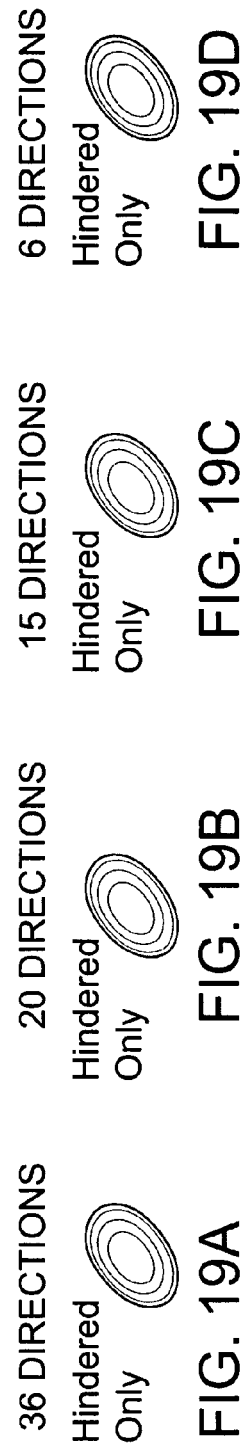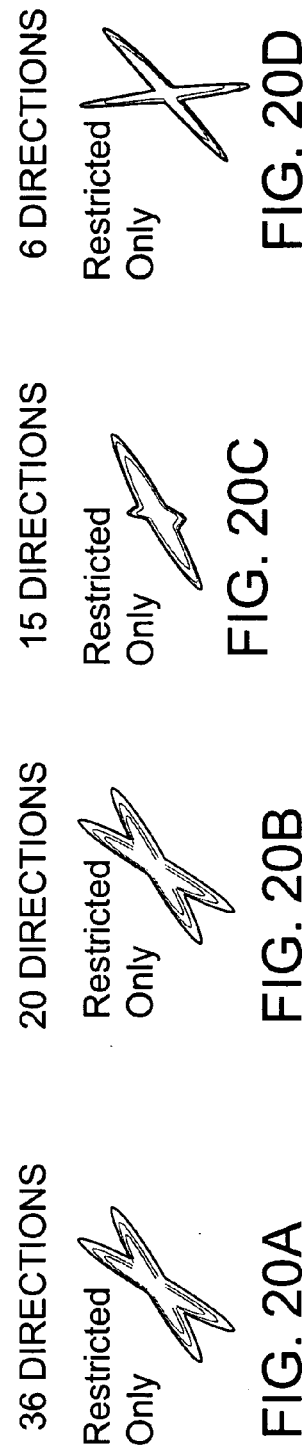

FIG. 21A NF 0.03 Combined
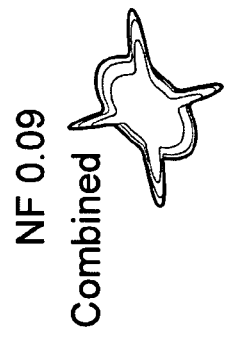
FIG. 21B NF 0.06 Combined
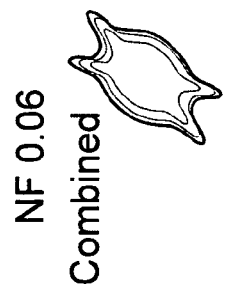
FIG. 21C NF 0.09 Combined
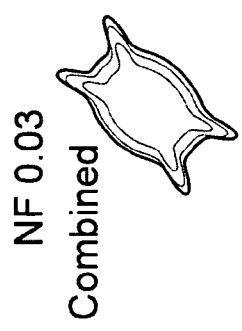
FIG. 21D NF 0.12 Combined
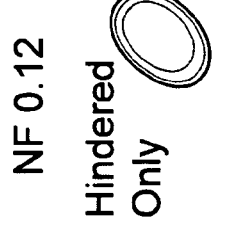
FIG. 22A NF 0.03 Hindered Only
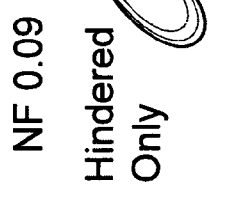
FIG. 22B NF 0.06 Hindered Only
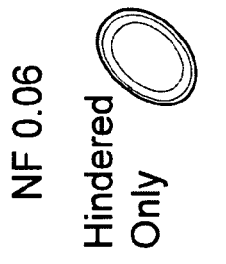
FIG. 22C NF 0.09 Hindered Only
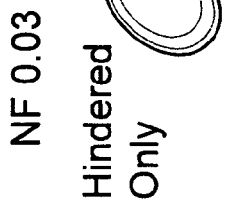
FIG. 22D NF 0.12 Hindered Only
FIG. 23A NF 0.03 Restricted Only
FIG. 23B NF 0.06 Restricted Only
FIG. 23C NF 0.09 Restricted Only
FIG. 23D NF 0.12 Restricted Only

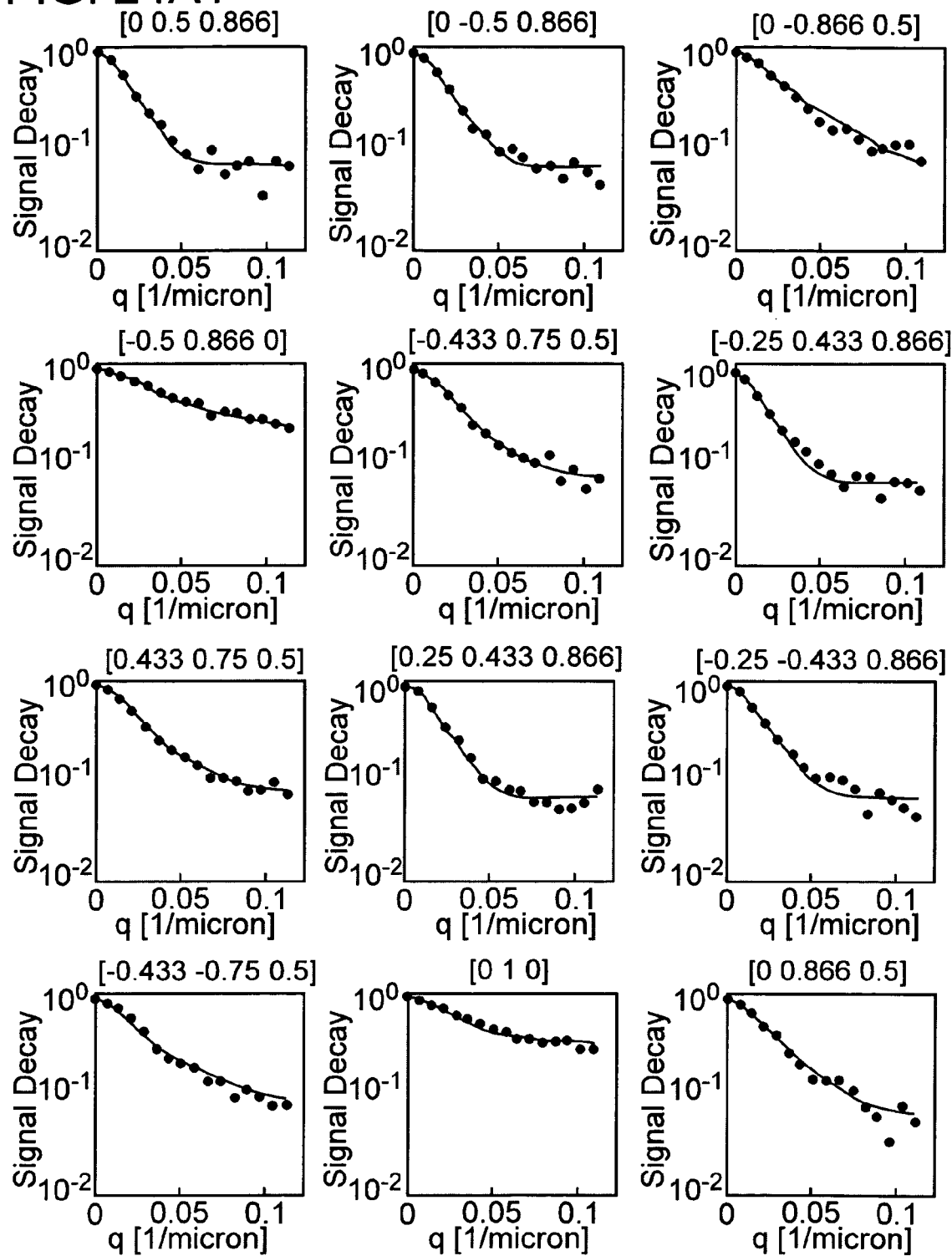
FIG. 24A1

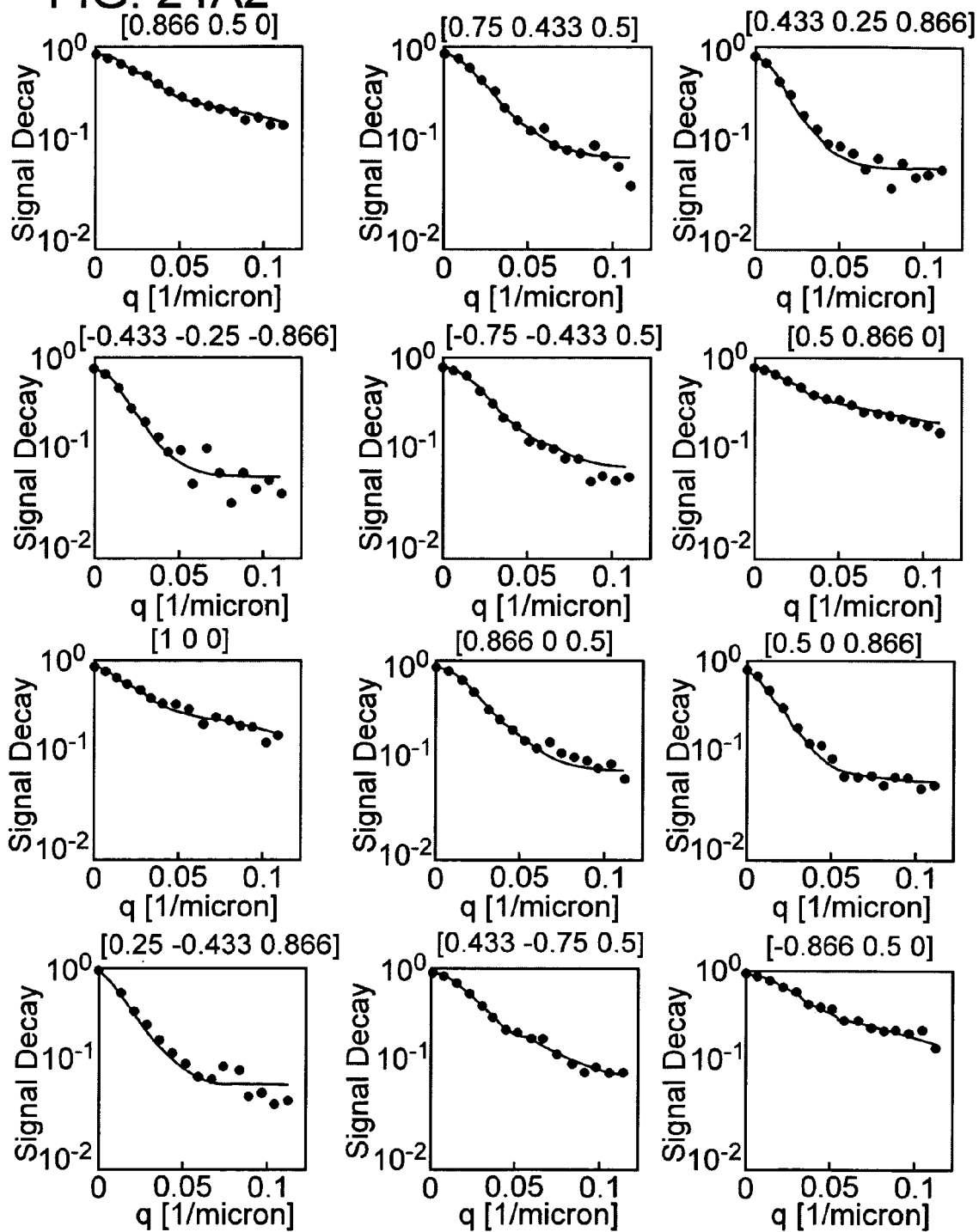
FIG. 24A2

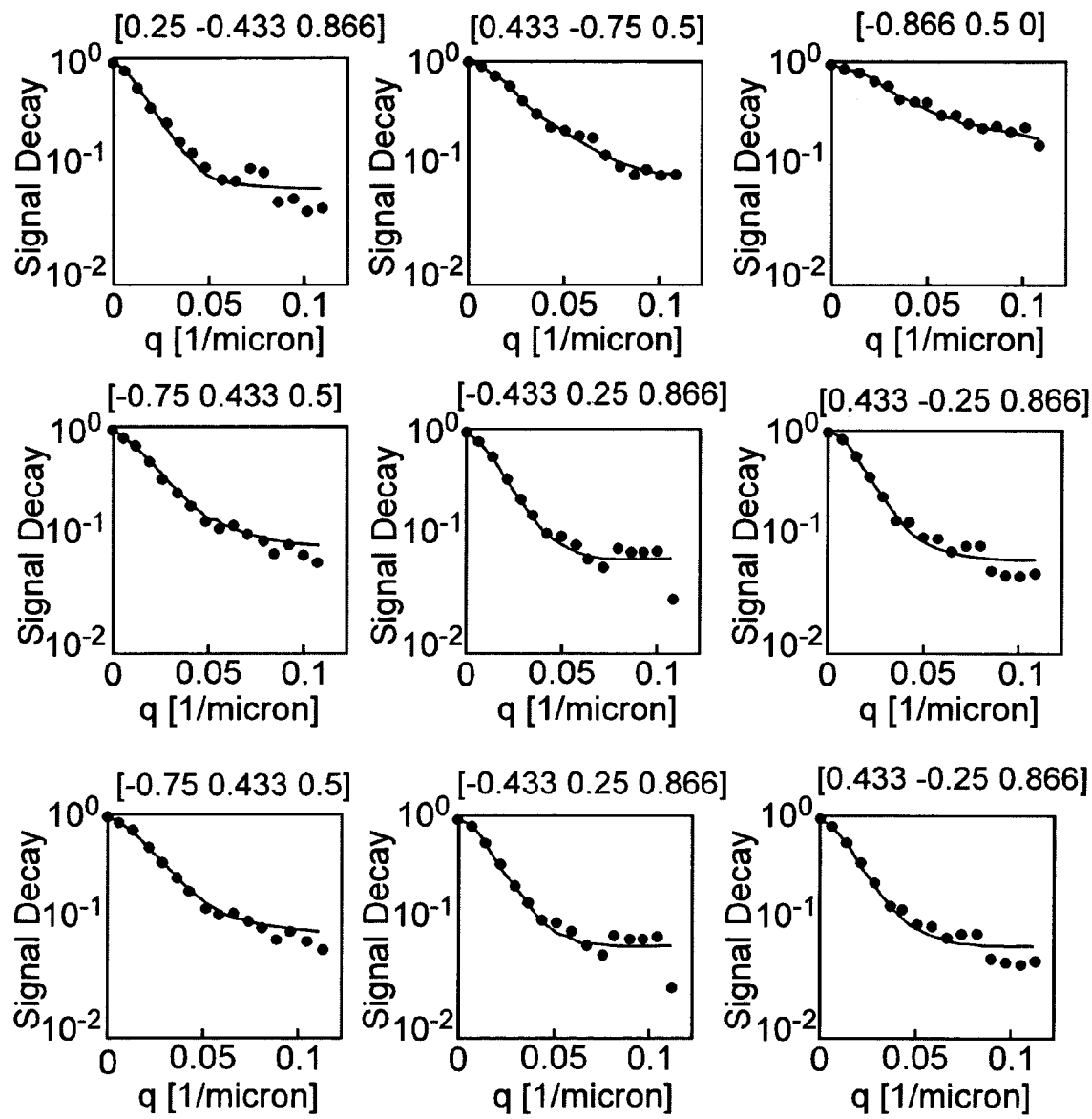
FIG. 24A3

DIFFUSION TENSOR AND Q-SPACE MRI SPECIMEN CHARACTERIZATION

CROSS-REFERENCE TO RELATED APPLICATIONS

This application claims the benefit of U.S. Provisional Patent Application 60/485,658, filed Jul. 8, 2003, and U.S. Provisional Patent Application 60/571,064, filed May 14, 2004, both of which are incorporated herein by reference.

STATEMENT OF GOVERNMENT RIGHTS

This invention was made with government support under a contract awarded by the Department of Health and Human Services, National Institutes of Health. The government has certain rights in the invention.

TECHNICAL FIELD

The invention pertains to magnetic resonance methods and apparatus.

BACKGROUND

Magnetic resonance imaging (MRI) has been used with a variety of specimens in clinical and other applications. In many examples, images are based on differences in the so-called $T_1$ and $T_2$ relaxation times in the specimen being imaged. In other examples, translational diffusion can be used as a relaxation mechanism that produces image contrast. While in some specimens, translational diffusion of spins is isotropic, in many important applications, specimens exhibit structural features that make translational diffusion anisotropy unlikely. To evaluate diffusion anisotropies of a specimen, so-called diffusion tensor (DT) methods such as those described in Basser et al., U.S. Pat. No. 5,539,310, can be used. These methods typically involve the application of pulsed-gradient magnetic fields in several directions. DT methods are generally based on 3-dimensional Gaussian spin-displacement profiles appropriate at small q-values, wherein q is proportional to a magnitude and a duration of an applied pulsed magnetic-field gradient ("PFG"). DT methods can fail to reveal important specimen properties when the 3-dimensional Gaussian displacement model is inapplicable, and improved MR methods and apparatus are needed.

SUMMARY

MR methods comprise obtaining a set of translational diffusion-weighted MR signals associated with a plurality of magnetic field gradient strengths and a plurality of magnetic field gradient directions. At least one parameter associated with translational diffusion in a restricted compartment and at least one parameter associated with translational diffusion in a hindered compartment are estimated based on the set of signals. In a representative example, the set of signals is a set of image signals. In additional examples, the estimated parameter associated with the restricted compartment corresponds to an orientation of the restricted compartment, a spin fraction associated with the restricted compartment, a dimension of the restricted compartment, or a diffusivity associated with the restricted compartment. In further examples, at least a second parameter associated with translational spin diffusion in a second restricted compartment is estimated. In additional examples, the estimated parameter associated with the hindered compartment is a spin fraction associated with the hindered compartment. In other examples, such methods include identifying signal portions of the set of signals with translational diffusion in the restricted compartment and translational diffusion in a hindered compartment. Signal portions corresponding to diffusion in the restricted compartment are associated with diffusion in an intra-axonal volume, and signal portions corresponding to translational diffusion in the hindered diffusion compartment are associated with diffusion in an extra-axonal volume.

Methods of analyzing a nerve fiber comprise obtaining an estimate of a spin fraction associated with restricted translational diffusion, and comparing the estimate of spin fraction with a control value of spin fraction. In some examples, the control value is a previous estimate of spin fraction associated with restricted diffusion. In additional examples, a series of estimates of spin fraction associated with restricted diffusion are obtained, and compared with corresponding control values. In other examples, an estimate of an orientation of a specimen portion associated with restricted diffusion is obtained.

MR apparatus comprise a pulsed-gradient field controller configured to apply pulsed gradient fields having a plurality of magnitudes in a plurality of directions. A signal generator is configured to apply a plurality of MR signals to excite spins in a portion of a specimen. A signal detector is configured to receive and record a plurality of MR signals associated with the applied PFGs and the applied MR signals. A processor is configured to estimate at least one parameter associated with translational diffusion in a compartment exhibiting restricted translational diffusion and at least one parameter associated with translational diffusion in a compartment exhibiting hindered diffusion based on the recorded MR signals. In some examples, a display is configured to exhibit a diffusion distance associated with translational diffusion in the restricted compartment and in the hindered compartment. In other examples, the processor is configured to estimate an orientation of the restricted compartment based on the recorded MR signals. In further examples, the processor is configured to estimate at least one diffusivity associated with the restricted compartment and with the hindered compartment.

Methods of tracking an orientation of a nerve fiber or other fiber comprise obtaining a set of diffusion-weighted MR signals associated with the fiber, and estimating a fiber orientation based on portions of the MR signals associated with restricted translational diffusion associated with the fiber. In other examples, an orientation of a second fiber is estimated based on portions of the MR signals associated with restricted translational diffusion associated with the second fiber.

These and other features and advantages are set forth below with reference to the accompanying drawings.

BRIEF DESCRIPTION OF THE DRAWINGS

FIGS. 11A-11D illustrate surfaces showing diffusion distances as a function of direction based on simulations of signals based on a single fiber orientation using PFGs in 36, 20, 15, and 6 directions, respectively.

FIGS. 12A-12D and FIGS. 13A-13D illustrate surfaces showing diffusion distances as a function of direction based on simulations using PFGs in 36, 20, 15, and 6 directions, respectively, for a hindered-diffusion component and a restricted-diffusion component, respectively, based on the simulated signals associated with FIGS. 11A-11D.

FIGS. 14A-14D illustrate surfaces showing diffusion distances as a function of direction based on application of PFGs in 36, 20, 15, and 6 directions, respectively, to two fibers arranged at 90 degrees relative to each other.

FIGS. 15A-15D and 16A-16D illustrate surfaces showing diffusion distances as a function of direction based on application of PFGs in 36, 20, 15, and 6 directions, respectively, for the hindered-diffusion component and the restricted-diffusion component, respectively, based on the simulated signals associated with FIGS. 14A-14D.

FIGS. 17A-17C illustrate surfaces showing diffusion distances as a function of direction based on application of PFGs in 36, 20, 15, and 6 directions, respectively, obtained without reference to a restricted-diffusion component.

FIGS. 18A-18D illustrate surfaces showing diffusion distances as a function of direction based on application of PFGs in 36, 20, 15, and 6 directions, respectively, for fibers arranged at an angle of 15 degrees relative to each other.

FIGS. 19A-19D and FIGS. 20A-20D illustrate surfaces showing diffusion distances as a function of direction based on application of PFGs in 36, 20, 15, and 6 directions, respectively, for the hindered-diffusion component and the restricted-diffusion component, respectively, associated with the simulated signals used in FIGS. 18A-18D.

FIGS. 21A-21D illustrate surfaces showing diffusion distances as a function of direction based on application of PFGs with signals associated with noise floor values (NFs) of 0.03, 0.06, 0.09, and 0.12, respectively, for fibers arranged at an angle relative to each other.

FIGS. 22A-22D and 23A-23D illustrate surfaces showing diffusion distances as a function of direction based on application of PFGs for the hindered diffusion component and the restricted diffusion component, respectively, and associated with noise floor values (NFs) of 0.03, 0.06, 0.09, and 0.12, respectively, for two fibers arranged at an angle relative to each other.

FIGS. 24A1-24A3 illustrate experimental data and single-fiber (one restricted compartment and one hindered compartment) data fits for a selected pixel associated with an area of homogeneous white matter of a pig spinal cord for PFGs applied in a plurality of directions.

DETAILED DESCRIPTION

Figure 1:
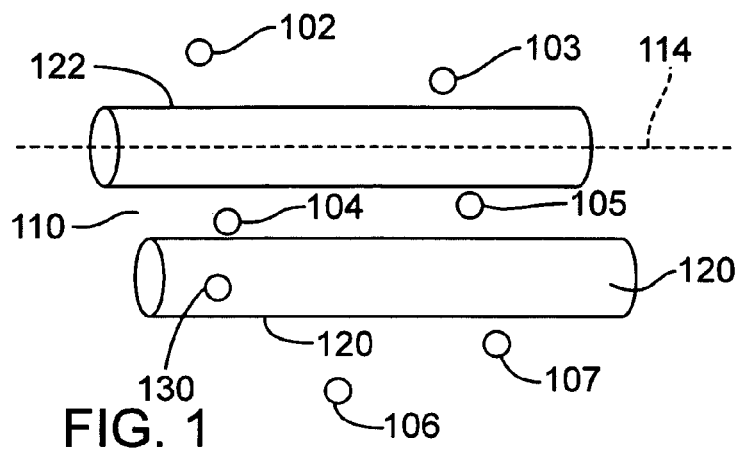
FIG. 1 is a schematic diagram illustrating diffusion of water molecules in an intra-axonal space and an extra-axonal space.

Magnetic resonance imaging (MRI) systems can be configured to produce diffusion-weighted images. Specimen translational diffusion anisotropy can be spatially varying, and specimen properties can vary as functions of one or more spatial coordinates. Such magnetic resonance (MR) analysis of anisotropic specimens can be used in many practical examples. For example, MR images of specimens exhibiting anisotropic translational diffusion such as brain white matter can be used in the diagnosis and therapy of a variety of disorders as well as the assessment of normal and abnormal brain development, degeneration, and aging. For convenience, MR methods and apparatus are discussed herein with reference to specimens such as brain white matter and other specific specimens, but such methods can be applied to other specimens that exhibit isotropic or anisotropic translational diffusion. A selected portion or portions of a specimen can be evaluated using MR techniques, or a plurality of locations can be evaluated and an associated image assembled. For convenience in the following description, evaluation of one or a few specimen portions is described. These portions can correspond to volume elements (voxels) of an MR image.

MR images are generally based on detection of a magnitude, phase, orientation, or other property of spins of one or more sample constituents. In some examples, a spatially varying magnetic field such as a pulsed-gradient magnetic field is applied to a specimen to produce a spatial variation in spin angular frequency, which results in a spatial variation in the phase of these spins. For convenience, spin encodings that make MR signals sensitive to net spin displacements are referred to as herein as diffusion-weighted spins, and such encodings are referred to as diffusion encodings. Diffusion-weighted MR signals and images are based on such diffusion-weighted spins. MR signals can be obtained that can be associated with isotropic or anisotropic translational diffusion. Such signals are referred to herein as "diffusion-weighted signals" and images based on such signals are referred to as "diffusion-weighted images." Methods of obtaining such signals are described in, for example, Basser, U.S. Pat. No. 5,539,310, that is incorporated herein by reference. In the following description, vector and tensor quantities are written in boldface.

Brain white matter is a representative anisotropic specimen. Brain white matter occupies a substantial fraction of brain volume, and is composed of ordered fascicles whose axons are surrounded by a complex extra-axonal environment containing astrocytes, glia, and extracellular matrix. Axons (nerve fibers) are structurally anisotropic as a function of position due to the extension of the axons along a local axis. Some axons have associated myelin sheaths, but small-diameter axons are typically not myelinated. The orientation of this local axis typically varies throughout a specimen, but in other anisotropic specimens a local axis or other anisotropy can be constant throughout the specimen. White matter can be locally anisotropic with respect to a local axonal axis, and MR signals obtained from white-matter specimens can reflect this anisotropy. In some specimens, axons are not locally aligned with respect to a single axis. Diffusion-weighted MR signals can be associated with spin diffusion parallel to and perpendicular to a local axonal axis (or a distribution of local axes) in intra-axonal volumes and/or extra-axonal volumes. Diffusion of spin-labeled species such as water molecules can be associated with so-called "hindered" diffusion in an extra-axonal space, and "restricted" diffusion in an intra-axonal space. As used herein, "hindered" diffusion typically refers to tortuous diffusion around diffusion barriers but without confinement to a particular volume, and "restricted" diffusion typically refers to diffusion constrained to a volume defined by surrounding diffusion barriers. MR signals can include contributions associated with restricted diffusion in the extra-axonal space as well, and such contributions can be analyzed in addition to the MR signal contributions associated with intra-axonal restricted diffusion. The extra-axonal contributions are generally small, and are not further described.

With reference to FIG. 1, representative water molecules 102-107 or other spin species are situated in an extra-axonal space 110 surrounding representative axons 120, 122 and exhibit anisotropic diffusion. The extra-axonal space 110 typically can contain extracellular matrix, proteins, oriented filaments, and glial cells such as astrocytes. For convenience, the axons 120, 122 are represented as cylinders. Diffusion in a direction parallel to a local axonal axis 114 is relatively unimpeded by the presence of the axons 120, 122, while diffusion in a direction perpendicular to the local axonal axis 114 is impeded by the axons 120, 122. Diffusion in the extra-axonal space 110 is referred to as "hindered." A water molecule 130 or other spins situated in an intra-axonal space of the axon 120 diffuses relatively freely in a direction parallel to the local axonal axis 114 but diffusion is impeded in a perpendicular direction because the water molecule 130 is confined within the axon 120. Diffusion in the intra-axonal space is referred to herein as "restricted." In some examples, spins are confined, and a diffusion distance is limited to a distance associated with a dimension of a so-called "restricted compartment." In other examples, spins in a restricted compartment can diffuse out of the compartment, while in other examples, spins remain substantially confined during any practical measurement interval. Spins exterior to a restricted compartment can also diffuse into the restricted compartment. Typically, diffusion in a restricted volume or along a restricted direction is associated with a diffusion distance that initially increases linearly as a function of a square root of diffusion time but then appears to saturate. In contrast, unrestricted diffusion is generally associated with a diffusion distance that continues to increase as a function of diffusion time. In some examples, such a diffusion distance increases linearly as a function of the square root of the diffusion time. Axons are represented as cylinders in FIG. 1 so that the axon interior and exterior extend along a common axis, but in other examples, the axon interior and exterior extend along different axes. In addition, the representative axons 120, 122 are shown as having a common diameter, but specimens can have axons of different diameters, and spins can be confined within volumes having elliptical or other cross-sections.

MR signals associated with diffusion can be produced using a pulsed field gradient (PFG) sequence that is typically used in so-called q-space MRI, but other pulse sequences can be used. In q-space MRI, a sample portion is situated in a static magnetic field, typically for a duration long enough to permit some or all spins of one or more species in the sample portion to align with the static magnetic field. A radiofrequency (RF) pulse generator is configured to produce an RF pulse (a so-called π/2-pulse) so that specimen spins are rotated into a plane perpendicular to the static magnetic field. A gradient pulse described by a gradient-pulse waveform G(t) associated with a magnetic field gradient $G_0$ having an effective pulse duration δ is applied to produce a spin rotation of $q=(1/2\pi)\gamma G_0 \delta$, wherein γ is a gyromagnetic ratio and q is the magnitude of q. In some examples, the duration δ is sufficiently short so that spin displacements during the application of the gradient-pulse waveform G(t) are small compared to spin displacements that occur during a diffusion time Δ after which spin diffusion is measured, and spin diffusion during the gradient-pulse duration δ can be neglected. The magnetic field produced by application of the gradient-pulse waveform G(t) is a function of spatial coordinates, and application of the gradient pulse produces a spatially tagged spin distribution. During the diffusion time Δ, the spin-labeled species move (by, for example, diffusion) and the spatially tagged spin distribution changes. Another RF pulse (a so-called π-pulse) is applied followed by a reapplication of the PFG. The combination of the π-pulse and the PFG tends to reverse the spatial tagging of spins, but does not reverse changes in the spatial spin distribution associated with diffusion or other spin displacements. Therefore, the MR signal obtained after application of this sequence can be associated with spin diffusion or other spin displacements in the specimen. Many other pulse sequences can be used, and other examples are described in, for example, P. Callaghan, *Principles of Nuclear Magnetic Resonance Microscopy* (Oxford University Press, 1991). In some examples, described in, for example, R. Kimmich, *NMR: Tomography, Diffusometry, Relaxometry* (Springer Verlag 1997), a diffusion sequence or "diffusion filter" can be applied before the imaging sequence.

If translational spin diffusion produces a 3-dimensional Gaussian displacement distribution and δ<<Δ, then an MR signal produced using the PGF sequence can be expressed as:

$$|E(q)|=\exp(-4\pi^2 q^T Dq\Delta),$$

wherein D is a diffusion tensor, and $q^T$ is the transpose of q, i.e., $q^T$ is a row vector corresponding to the column vector q. By application of a series of gradient pulses in different directions, estimates of the values of the elements of the tensor D can be obtained. Depending on magnitudes of the pulse-gradient duration δ and the diffusion time Δ, an effective diffusion time $\Delta_{eff}=\Delta-\delta/3$ can be used in the above expression instead of the diffusion time Δ. A similar expression can be obtained for MR signals in isotropic specimens. In some examples, expressions for MR signals can be expressed in terms of a so-called "b-value," wherein b is proportional to a product of $(\gamma G_0 \delta)^2$ and the effective diffusion time.

Modeling Overview

MRI evaluation of anisotropic specimens can be based on modeling of translational diffusion of spins. Spins in anisotropic specimens typically can be associated with either a hindered compartment in which spins diffuse in three dimensions without substantial impairment or to a restricted compartment in which spin diffusion is confined in at least one direction due to specimen structure. An MR signal can be decomposed into signal portions associated with a hindered spin fraction and a signal portion associated with a restricted spin fraction. The signal portion associated with the hindered spin fraction typically exhibits Gaussian diffusion decay while the signal portion associated with the restricted spin fraction exhibits non-Gaussian decay. In the restricted compartment, diffusion along one or more axes can be assumed to be uncorrelated so that diffusion along these axes can be modeled independently. In some examples, diffusion in a restricted compartment can be modeled along some directions as hindered diffusion and associated with a Gaussian diffusion decay. For example, for spins confined within a cylindrical volume, diffusion along a cylinder axis can be modeled as hindered, while diffusion perpendicular to the cylinder axis is restricted and exhibits non-Gaussian diffusion decay. In some cases, the restricted compartments can be represented as an ensemble of different, similar, or identical dimensions but with different orientations. This modeling framework can also reflect exchange of spins between the restricted compartment and the hindered compartment, a variety of diffusion models can be selected for modeling of the compartments based on, for example, MR signal-acquisition characteristics. This modeling framework can be referred to as a "composite hindered and restricted model of diffusion"(CHARMED). Application of this modeling framework to brain white matter is described below as a representative but significant example.

Modeling of Magnetic Resonance Signals in Brain White Matter

MR signals associated with brain white matter generally decrease mono-exponentially as a function of q for small values of q (small b-values), which is indicative of a 3-D Gaussian displacement distribution. For large q-values (large b-values), observed decay is not mono-exponential, and a residual signal may persist above the noise floor (NF). Based on the above expression for Gaussian decay, observed signal decay is expected to be mono-exponential for all values of q (or b), and the conventional diffusion-tensor approach is inadequate to describe such observed signals and to permit assessment of sample properties associated with such signals. MR signals such as those associated with diffusion imaging of brain white matter can be modeled as described below consistently with observed signals. Based on such consistent modeling, specimen characteristics associated with observed signals can be estimated.

An MR signal $E(q,\Delta)$ associated with brain white matter can be expressed as a weighted sum of contributions $E_h(q,\Delta)$, $E_r(q,\Delta)$ associated with spins that exhibit hindered diffusion or restricted diffusion, respectively:

$$E(q,\Delta)=f_h\cdot E_h(q,\Delta)+f_r E_r(q,\Delta), \quad [1]$$

wherein $f_h$ is a fraction of specimen spins associated with hindered diffusion, $f_r$ is a fraction of specimen spins associated with restricted diffusion, and the subscripts h, r refer to hindered and restricted specimen fractions, respectively. The fractions $f_h$, $f_r$ are typically $T_2$-weighted volume fractions. The values of $T_2$ for the restricted and hindered components need not be equal. In many specimens, the restricted fraction is substantially confined, and there is limited exchange between spins in the restricted and the hindered fraction. In such specimens, exchange between the restricted and hindered spins is referred to as "slow," and a "slow exchange" limit can be used to assess signal attenuation. In other examples, exchange between the restricted and hindered fractions can be included. Typical time constants associated with intracellular and intraaxonal exchange are about 10-25 ms and 400-700 ms, respectively.

A corresponding fast-exchange limit can be written as a volume-fraction-weighted expression as follows:

$$E(q,\Delta)=E_h(q,\Delta)^{f_h} \times E_r(q,\Delta)^{f_r}.$$

Intra-Axonal (Restricted) Diffusion

The MR signal $E_r(q,\Delta)$ associated with intra-axonal (restricted) diffusion can be expressed as a combination of signal contributions $E_{//}(q,\Delta)$ $E_\perp(q,\Delta)$ associated with spin diffusion parallel to and perpendicular to the local axonal axis, respectively. The perpendicular component contribution $E_\perp(q,\Delta)$ can be modeled based on, for example, diffusion in impermeable cylinders as described in P. T. Callaghan, "Pulsed Gradient Spin Echo NMR for Planar, Cylindrical and Spherical Pores Under Condition of Wall Relaxation," J. Magn. Reson. A113:53-59 (1995). The parallel-component contribution $E_{//}(q,\Delta)$ can be modeled as free or hindered 1-dimensional diffusion described by a Gaussian displacement distribution. These contributions can be decoupled as shown below.

The measured MR signal $E_r(q,\Delta)$ associated with restricted diffusion can be expressed as:

$$E_r(q,\Delta)=\int \overline{P}_s(R,\Delta)\exp(i2\pi q\cdot R)dR,$$

wherein $\overline{P}_s(R,\Delta)$ is a spin-displacement propagator associated with a number density of spins having a displacement R at a diffusion time Δ.

For diffusion associated with an intra-axonal volume, displacements parallel and perpendicular to the local axonal axis are statistically independent:

$$\overline{P}_s(R,\Delta)=\overline{P}_\perp(R_\perp,\Delta)\overline{P}_{//}(R_{//},\Delta),$$

wherein $P_\perp$ and $P_{//}$ are spin displacement distributions associated with displacements perpendicular to and parallel to the local axonal axis, respectively. The displacement R can be expressed as a sum of displacement components $R_{//}$, $R_\perp$ that are parallel and perpendicular to the local axonal axis so that $R=R_{//}+R_\perp$. The MR signal $E_r(q,\Delta)$ associated with restricted diffusion can then be expressed as:

$$E_r(q,\Delta)=\int\int\int \overline{P}_\perp(R_\perp,\Delta)\overline{P}_{//}(R_{//},\Delta)\exp(i2\pi q\cdot(R_\perp+R_{//}))dR_\perp dR_{//}$$

The exponential functions associated with the parallel displacement $R_{//}$ and the perpendicular displacement $R_\perp$ can also be separated:

$$E_r(q,\Delta) = \int\int \bar{P}_{195}(R_\perp,\Delta)\exp(i2\pi q \cdot R_\perp)dR_\perp$$
$$\bar{P}_{//}(R_{//},\Delta)\exp(i2\pi q \cdot R_{//})dR_{//},$$

and the integrals can be separated as follows:

$$E_r(q,\Delta) = \int\int \bar{P}_\perp(R_\perp,\Delta)\exp(i2\pi q \cdot R_\perp)dR_\perp$$
$$\int \bar{P}_{//}(R_{//},\Delta)\exp(i2\pi q \cdot R_{//})dR_{//}.$$

The vector q can also be expressed as a vector sum of components $q_{//}$ and $q_\perp$ that are parallel and perpendicular to the local axonal axis so that $q=q_{//}+q_\perp$. Thus, $$E_r(q,\Delta) = \int\int \bar{P}_\perp(R_\perp,\Delta)\exp(i2\pi (q_{//}+q_\perp) \cdot R_\perp)dR_\perp \cdot$$
$$\int \bar{P}_{//}(R_{//},\Delta)\exp(i2\pi(q_{//}+q_\perp) \cdot R_{//})dR_{//}$$

Because the dot products $q_{//} \cdot R_\perp = q_\perp \cdot R_{//} = 0$, the MR signal $E_r(q,\Delta)$ can be written as:

$$E_r(q,\Delta) = \int\int \bar{P}_\perp(R_\perp,\Delta)\exp(i2\pi q_\perp \cdot R_\perp)dR_\perp$$
$$\int \bar{P}_{//}(R_{//},\Delta)\exp(i2\pi q_{//} \cdot R_{//})dR_{//}.$$

For convenience, $E_\perp(q_\perp)$ and $E_{//}(q_{//})$ are defined as follows:

$$E_\perp(q_\perp) = \int\int \bar{P}_\perp(R_\perp,\Delta)\exp(i2\pi q_\perp \cdot R_\perp)dR_\perp, \text{ and}$$

$$E_{//}(q_{//}) = \int \bar{P}_{//}(R_{//},\Delta)\exp(i2\pi q_{//} \cdot R_{//})dR_{//}.$$

Therefore, the MR signal $E_r(q,\Delta)$ can be expressed as $$E_r(q,\Delta) = E_\perp(q_\perp,\Delta)E_{//}(q_{//},\Delta).$$

Thus, statistical independence of displacements parallel and perpendicular to a local axonal axis implies that the net MR signal $E_r(q,\Delta)$ can be expressed as a product of signals associated with diffusion parallel and perpendicular to the local axonal axis. Similar decompositions can be provided for other geometries. For example, a restricted volume situated between planar barriers can be associated with diffusion components parallel to the planar barriers and perpendicular to the planar barriers. In other examples, the restricted volume has a rectangular, square, or elliptical cross-section and signal contributions can be similarly analyzed. There can be a subset of spins that are close to a wall and can undergo effective 2-D diffusion predominantly parallel to the surface of the wall.

Modeling of $E_{//}(q_{//},\Delta)$ and $E_\perp(q_\perp,\Delta)$

Diffusion parallel to the local axonal axis can be modeled as free diffusion associated with a Gaussian displacement distribution:

$$P_{//}(R_{//},\Delta) = \frac{1}{(4\pi D_{//}\Delta)^{1/2}} e^{-|R_{//}|^2/(4D_{//}\Delta)},$$

wherein $D_{//}$ is a spin-diffusion coefficient inside the axon for diffusion parallel to the local axis. Using this Gaussian displacement distribution for $P_{//}$ the associated MR signal $E_{//}(q_{//},\Delta)$ can be expressed using the well-known Stejskal and Tanner formula:

$$E_{//}(q_{//},\Delta) = e^{-4\pi^2|q_{//}|^2 \Delta D_{//}}.$$

In some examples, the duration of the applied gradient pulse and the diffusion time are comparable, and the MR signal associated with diffusion parallel to the local axis can be obtained using the effective diffusion time $\Delta_{eff}=\Delta-\delta/3$:

$$P_{//}(R_{//},\Delta) = \frac{1}{\left(4\pi D_{//}\left(\Delta-\frac{\delta}{3}\right)\right)^{1/2}} e^{-|R_{//}|^2/\left(4D_{//}\left(\Delta-\frac{\delta}{3}\right)\right)},$$

so that $$E_{//}(q_{//}) = e^{-4\pi^2|q_{//}|^2\left(\Delta-\frac{\delta}{3}\right)D_{//}}.$$

The MR signal component $E_\perp(q_\perp,\Delta)$ associated with diffusion perpendicular to the local axonal axis can be modeled using, for example, an expression for $E_\perp(q_\perp,\Delta)$ for restricted diffusion in a cylinder given in P. T. Callaghan and cited above:

$$E_\perp(q_\perp,\Delta) = \sum_k 4\exp\left[-\beta_{0k}^2 D_\perp \Delta/a^2\right] \times \left[\frac{(2\pi|q_\perp|a)J_0'(2\pi|q_\perp|a)}{(2\pi|q_\perp|a)^2 - \beta_{0k}^2}\right]^2 +$$
$$\sum_{nk} 8\exp\left[-\beta_{nk}^2 D_\perp \Delta/a^2\right] \times \frac{\beta_{nk}^2}{\beta_{nk}^2 - n^2} \times$$
$$\left[\frac{(2\pi|q_\perp|a)J_n'(2\pi|q_\perp|a)}{(2\pi|q_\perp|a)^2 - \beta_{nk}^2}\right]^2$$

wherein n, k are non-negative integers, $J_n$ is first derivative of the Bessel function $J_n$, $D_\perp$ is a diffusion coefficient motion perpendicular to the restrictive barrier, and a is radius of a cylinder used to approximate axon structure, and $\beta_{nk}$ are values selected to satisfy diffusion-boundary conditions.

In clinical MR measurements, the pulse-field-gradient approximation ($\delta\sim 0, \delta<<\Delta$) is typically not satisfied, and the gradient field can be approximated as a constant field gradient. Alternatively, an asymptotic form of the MR signal $E_\perp(q_\perp,\Delta)$, based on application of a constant-field gradient (and not a pulsed-field gradient) described in C. H. Neuman, "Spin echo of spins diffusing in a bounded medium," J. Chem. Phys. 60:4508-4511 (1974), can be used:

$$E_\perp(G_\perp, 2\tau) = \exp\left(-\frac{R^4\gamma^2 G_\perp^2}{D_\perp}\frac{7}{96}\left(2\tau - \frac{99}{112}\frac{R^2}{D_\perp}\right)\right),$$

wherein R is an axon radius, $G_\perp$ is a component of G perpendicular to the axonal axis, $D_\perp$ is a diffusion coefficient for diffusion perpendicular to the local axonal axis, and $2\tau$ is the echo time (TE or $T_E$) of the signal acquisition. This asymptotic expression is suitable for many clinical experiments in which the duration $\Delta$ of a pulsed-gradient field is approximately equal to the diffusion time $\Delta(\delta\sim\Delta)$ and small-gradient-pulse (SGP) assumptions are no longer even approximately satisfied. This expression can be rewritten as a function of q:

$$E_\perp(q_\perp, 2\tau) = \exp\left(-\frac{4\pi^2 R^4 |q_\perp|^2}{D_\perp \tau}\frac{7}{96}\left(2 - \frac{99}{112}\frac{R^2}{D_\perp \tau}\right)\right).$$

The MR signal $E_\perp$ is a Gaussian function of q and can be written more compactly as a function of two dimensionless parameters, $q_\perp' = q_\perp R$ and $\beta = R^2/(D_\perp\tau)$:

$$E_\perp(q'_\perp, \beta) = \exp\left(-4\pi^2 \beta |q'_\perp|^2 \frac{7}{96}\left(2 - \frac{99}{112}\beta\right)\right).$$

For $\beta<1$, the diffusion time is sufficient for most spins to reach a diffusion barrier, while for $\beta>1$ the diffusion time is insufficient time for most spins to reach a diffusion barrier. As $\beta$ approaches 2.26, the exponent approaches 0, and $E_\perp(q_\perp,\beta)$ becomes a constant. For larger $\beta$, the asymptotic solution is physically unrealistic as it grows monotonically as a function of q'. In clinical experiments, even for large-diameter axons, the condition $\beta<2$ is generally satisfied, and this expression can be used. Similarly, values of q'>1 are associated with length scales that are less that the radius of the cylinder, and q'<1 indicates that the length scale probed is larger than the radius of the cylinder.

The above expressions for the parallel and perpendicular signal contributions can be combined to provide an expression for the signal contribution associated with diffusion in the intraxonal volume:

$$E_r(q, \Delta) = e^{-4\pi^2 |q_{//}|^2 \left(\Delta - \frac{\delta}{3}\right)D_{//}} \cdot e^{-\frac{4\pi^2 R^4 |q_\perp|^2}{D_\perp \tau} \frac{7}{96}\left(2 - \frac{99}{112}\frac{R^2}{D_\perp \tau}\right)}.$$

This expression describes the MR signal associated with diffusion in an array of cylinders of radius R.

Computation of $q_{//}$ and $q_\perp$

Figure 2:
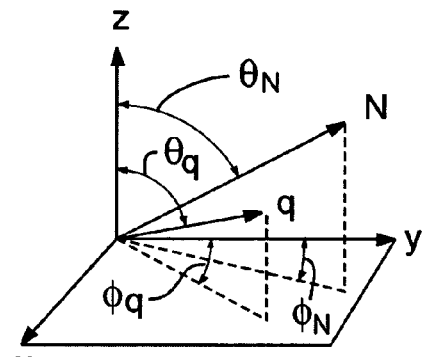
FIG. 2 is a diagram illustrating angular coordinates of a vector q and a local axonal axis N in a spherical coordinate system.

The components $q_{//}$ and $q_\perp$ can be calculated as:

$$|q_\perp| = |q|\sqrt{1 - \left(\sin(\theta_q)\sin(\theta_N)\cos(\varphi_q - \varphi_N) + \cos(\theta_q)\cos(\theta_N)\right)^2} \text{ and}$$

$$|q_{//}| = |q| \cdot |\sin(\theta_q)\sin(\theta_N)\cos(\phi_q - \phi_N) + \cos(\theta_q)\cos(\theta_N)|,$$

wherein angular coordinates of q are $\theta_q$, $\phi_q$ and angular coordinates of the axonal axis are $\theta_N$, $\phi_N$ with respect to coordinate axes as illustrated in FIG. 2.

Extra-Axonal (Hindered) Diffusion

Extra-axonal spins exhibit hindered diffusion and can be associated with a 3-dimensional Gaussian displacement distribution. This hindered diffusion can be anisotropic, and can be characterized by an effective diffusion tensor D so that the MR signal component $E_h(q,\Delta)$ can be written as:

$$E_h(q,\Delta) = e^{-4\pi^2 \Delta q^T D q}$$

If this anisotropic diffusion is associated with reflections at the axons and an increased tortuosity produced by the axons, one principal axis of the diffusion tensor D is expected to be parallel or substantially parallel to the local axonal axis. Thus, one eigenvector of D is expected to be parallel to the local axonal axis and two other eigenvectors are expected to be perpendicular to the local axonal axis. Because $q = q_{//} + q_{195}$, the quadratic form $q^T D q$ can be written as:

$$q^T D q = (q_\perp + q_{//})^T D(q_\perp + q_{//}) = q_\perp^T D q_\perp + q_{//}^T D q_{//} + q_\perp^T D q_{//} + q_{//}^T D q_\perp = q_\perp^T D q_\perp + q_{//}^T D q_{//} = q_\perp \cdot q_\perp \lambda_\perp + q_{//} \cdot q_{//} \lambda_{//} = |q_\perp|^2 \lambda_\perp + |q_{//}|^2 \lambda_{//}$$

so that $$E_h(q,\Delta) = e^{-\Delta^2 \Delta(|q_\perp|^2 \lambda_\perp + |q_{//}|^2 \lambda_{//})},$$

wherein $\lambda_{//}$ and $\lambda_\perp$ are principal diffusivities in the extra-axonal space in directions parallel to and perpendicular to the local axonal axis, respectively. This expression shows that spin motion such as diffusion in the parallel and perpendicular directions can also be considered to be statistically independent because the associated MR signal is a product of distributions associated with diffusion parallel and perpendicular to the local axonal axis:

$$E_h(q,\Delta) = e^{-4\pi^2 \Delta(|q_\perp|^2 \lambda_\perp + |q_{//}|^2 \lambda_{//})} = e^{-4\pi^2 \Delta |q_\perp|^2 \lambda_\perp} \times e^{-4\pi^2 \Delta |q_{//}|^2 \lambda_{//}}$$

In some examples, the PFG approximation is inappropriate, and the applied gradient field can be approximated as a constant-gradient field. In such cases, the diffusion time can be replaced with the effective diffusion time $\Delta_{eff} = \Delta - \delta/3$.

Composite of Restricted and Hindered Solutions

The above expressions can be combined to obtain an approximation for the MR signal associated with hindered diffusion in an extra-axonal volume and restricted diffusion in an intra-axonal volume:

$$E(q, \Delta) = f_h \cdot e^{-4\pi^2 \left(\Delta - \frac{\delta}{3}\right)(|q_\perp|^2 \lambda_\perp + |q_{//}|^2 \lambda_{//})} +$$

$$f_r \cdot e^{-4\pi^2 |q_{//}|^2 \left(\Delta - \frac{\delta}{3}\right)D_{//} - \frac{4\pi^2 R^4 |q_\perp|^2}{D_\perp \tau} \frac{7}{96}\left(2 - \frac{99}{112}\frac{R^2}{D_\perp \tau}\right)}$$

In other examples, the form of $E(q,\Delta)$ can be different, but will include a combination of contributions associated with a restricted and a hindered compartment. The form of the contributions can depend on, for example, specimen microstructural properties and/or pulse sequences applied to the specimen.

Multiple Restricted/Hindered Diffusion

A similar analysis can be applied to diffusion associated with multiple restricted and/or hindered volumes:

$$E(q, \Delta) = \sum_{i=1}^{M} f_h^i \cdot E_h^i(q, \Delta) + \sum_{j=1}^{N} f_r^j \cdot E_r^j(q, \Delta), \quad [2]$$

wherein M is a number of distinct hindered compartments and N is a number of distinct restricted compartments. N and M are not necessarily equal. In this analysis, it is assumed that there is no exchange between compartments during MR signal acquisition.

A particularly useful form of this equation is:

$$E(q, \Delta) = f_h \cdot E_h(q, \Delta) + \sum_{j=1}^{N} f_r^j \cdot E_r^j(q, \Delta),$$

wherein $E_h(q,\Delta)$ is given by $$E_h(q, \Delta) = e^{-4\pi^2 \left(\Delta - \frac{\delta}{3}\right)(q^T D q)},$$

and D is the effective diffusion tensor. At low q-values, the effective diffusion tensor represents a powder average of all diffusion tensors in the various hindered sub-compartments, and a single tensor can be used to approximate the signal at low q-values.

Modeling of Brain Gray Matter

In another example, a similar division of MR signal contributions for brain gray matter can be based on signal contributions associated with intra-neuronal and extra-neuronal specimen portions. Gray matter fibers are dendrites and somatic processes that are much smaller in diameter than intra-axonal spaces in white matter. The structures of gray matter are quasi-randomly oriented rather than orientationally coherent. In addition, regions of hindered anisotropic diffusion surrounding gray matter structures are microscopic, and signals associated with gray matter typically are associated with an aggregation of microscopic structures that have appreciable exchange. For example, small fibers in which diffusion is restricted can be assumed to be randomly oriented and uniformly distributed within a macroscopic gray-matter-volume element (voxel). This results in a similar expression for analogous formula for the restricted region in the PFG limit:

$$E_\perp(q_\perp, \Delta) = \sum_k 4\exp[-\beta_{0k}^2 D_\perp \Delta/a^2] \times \left[\frac{(2\pi|q|a)J_0'(2\pi|q|a)}{(2\pi|q|a)^2 - \beta_{0k}^2}\right]^2 +$$

$$\sum_{nk} 8\exp[-\beta_{nk}^2 D_\perp \Delta/a^2] \times \frac{\beta_{nk}^2}{\beta_{nk}^2 - n^2} \times \left[\frac{(2\pi|q|a)J_n'(2\pi|q|a)}{(2\pi|q|a)^2 - \beta_{nk}^2}\right]^2$$

or in the asymptotic limit of the constant gradient assumption:

$$E_\perp(q, 2\tau) = \exp\left(-\frac{4\pi^2 R^4 |q|^2}{D_\perp \tau} \frac{7}{96}\left(2 - \frac{99}{112}\frac{R^2}{D_\perp \tau}\right)\right)$$

with the parallel component of the signal being given by:

$$E_{//}(q_{//}) = e^{-4\pi^2 |q|^2 \Delta D_{//}}.$$

Thus, the net contribution from this restricted compartment is:

$$E_r(q, \Delta) = E_\perp(q_\perp, \Delta)E_\|(q_\|, \Delta) = e^{-4\pi^2 |q|^2\left((D_{//}\Delta) + \frac{R^4}{D_\perp \Delta}\frac{7}{96}\left(2 - \frac{99}{112}\frac{R^2}{D_\perp \Delta}\right)\right)}$$

assuming $\tau = \Delta$.

It can be assumed that diffusion in the extra-axonal volume is anisotropic but randomly oriented and uniformly distributed within a gray-matter voxel. For convenience, it is assumed that there is no exchange between intra- and extra-neuronal volumes. A powder average over these individual compartments can be used to estimate E(q) for gray matter as a powder average on a microscopically anisotropic but macroscopically isotropic hindered medium:

$$E_h(q, \Delta) = e^{-4\pi^2 \Delta |q|^2 \left(\frac{\lambda_{//} + 2\lambda_\perp}{3}\right)}$$

wherein $$\frac{\lambda_{//} + 2\lambda_\perp}{3}$$

can be interpreted as an orientationally-averaged average diffusion coefficient. See, for example, Kärger et al., "Principles and applications of self-diffusion measurements by NMR," Adv. Magn. Reson. 12:1-89 (1988). A similar division into hindered and restricted portions can be expressed as:

$$E(q,\Delta) = f_h \cdot E_h(q,\Delta) + f_r \cdot E_r(q, \Delta).$$

This expression exhibits a decay that is clearly not described by a single Gaussian. Because the sub-compartments are microscopic, the compartments can exhibit fast exchange so that:

$$E(q,\Delta) = E_h(q,\Delta)^{f_h} \times E_r(q,\Delta)^{f_r}$$

which becomes:

$$E(q, \Delta) = e^{-4\pi^2 |q|^2 \left(\Delta\left(\frac{\lambda_{//} + 2\lambda_\perp}{3}\right)f_h + \left((\Delta D_{//}) + \frac{R^4}{D_\perp \Delta}\frac{7}{96}\left(2 - \frac{99}{112}\frac{R^2}{D_\perp \Delta}\right)\right)f_r\right)}$$

assuming $\tau = \Delta$. This expression exhibits a decay consistent with a single Gaussian although its features can depend on experimental parameters, particularly diffusion time and fiber dimensions. A formula for an effective diffusivity can be obtained from the exponent above.

Johnson Noise

Measured signals can be modeled in the presence of noise as:

$$E(q,\Delta) = \sqrt{(f_h \cdot E_h(q,\Delta) + f_r \cdot E_r(q,\Delta))^2 + \eta^2}, \text{ or}$$

$$E(q,\Delta) = \sqrt{(f_h \cdot E_h(q,\Delta) + f_r \cdot E_r(q,\Delta) + \eta)^2 + \eta^2}$$

wherein a random variable representing the Johnson-noise contribution can have a mean of zero and a standard deviation $\sigma$.

Modeling Summary

Signal portions associated with hindered diffusion $E_h(q,\Delta)$ are generally larger than other signal portions for small values of q, and some portions of an associated model signal can be fit to measured signals based on low q value measurements. Thus, the principal diffusivities $\lambda_{//}$ and $\lambda_\perp$ in the extra-axonal space can be estimated based on the Gaussian dependence of signal as a function of q. The signal portion associated with restricted diffusion $E_r(q,\Delta)$ is larger for large q values. Thus, parameters associated with restricted diffusion in the intra-axonal compartment, such as $D_{//}$ and $D_\perp$ can be determined based on measurements associated with larger values of q. Model parameters to be estimated can be dependent on a functional form selected for the signal $E_r(q,\Delta)$, and in particular for the contribution $E_\perp(q_\perp,\Delta)$. In other examples, large q and small q measurements can be considered simultaneously as model parameters are obtained. If two (or more) populations of nerve bundles are present or if nerve fibers are bent in some regions, model expressions can be based on distributions of nerve-fiber diameter and nerve-fiber orientation. Johnson noise can be included as a model parameter as well.

Signal Acquisition

Figure 3:
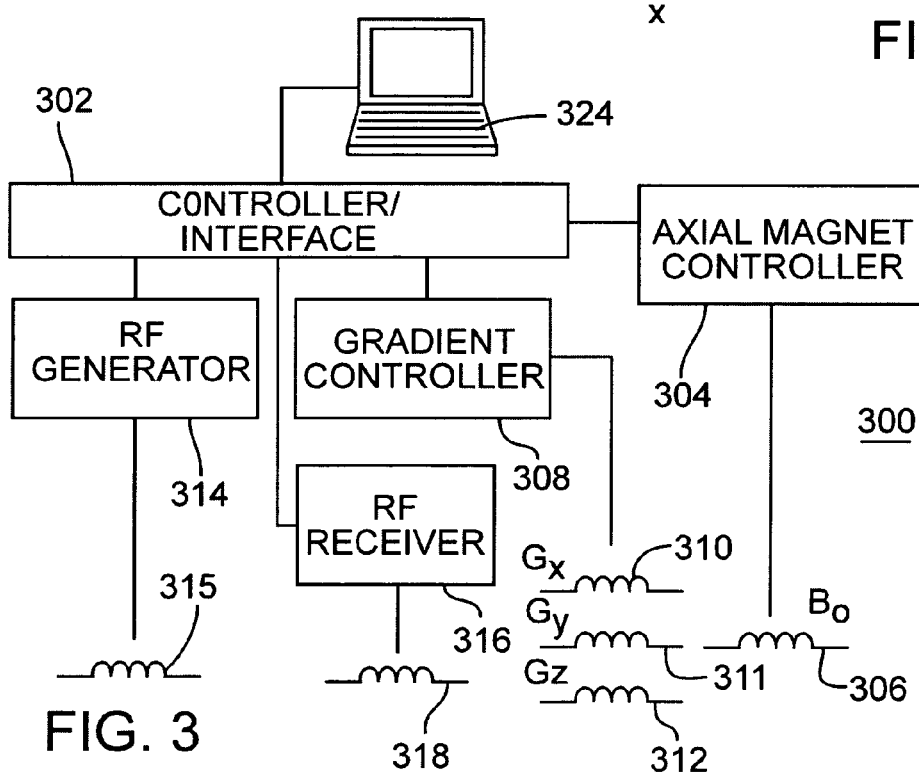
FIG. 3 is a schematic diagram of a magnetic resonance imaging (MRI) system.

MR signals that are modeled as described above can be obtained using an MRI apparatus 300 as illustrated in FIG. 3. The apparatus 300 includes a controller/interface 302 that can be configured to apply selected magnetic fields such as constant or pulsed fields to a specimen. An axial magnet controller 304 is in communication with an axial magnet 306 that is generally configured to produce a substantially constant magnetic field $B_0$. A gradient controller 308 is configured to apply a constant or time-varying gradient magnetic field in a selected direction or in a set of directions using magnet coils 310-312 to produce respective magnetic field gradients $G_x$, $G_y$, $G_z$, or combinations thereof. An RF generator 314 is configured to deliver one or more RF pulses to a specimen using a transmitter coil 315. An RF receiver 316 is in communication with a receiver coil 318 and is configured to detect or measure net magnetization of spins. Slice selection gradients can be applied with the same hardware used to apply the diffusion gradients.

The gradient controller 308 can be configured to produce pulses or other gradient fields along one or more axes. By selection of such gradients as described by, for example, Basser, U.S. Pat. No. 5,539,310, an effective diffusion tensor can be found. In addition, the gradient controller 308 can be configured to apply gradient pulses or other gradient magnetic fields of different magnitudes (i.e., different q-values), and associated MR signals can be detected by the RF receiver 316. A computer 324 or other processing system such as a personal computer, a workstation, a personal digital assistant, or a networked computer can be provided for data acquisition, control and/or analysis. The computer 324 generally includes a hard disk, a removable storage medium such as a floppy disk or CD-ROM, and other memory such as random access memory (RAM). Computer-executable instructions for data acquisition or control can be provided on a floppy disk or other storage medium, or delivered to the computer 324 via a local area network, the Internet, or other network. Signal acquisition, instrument control, and signal analysis can be performed with distributed processing. For example, signal acquisition and signal analysis can be performed at different locations.

Figure 4:
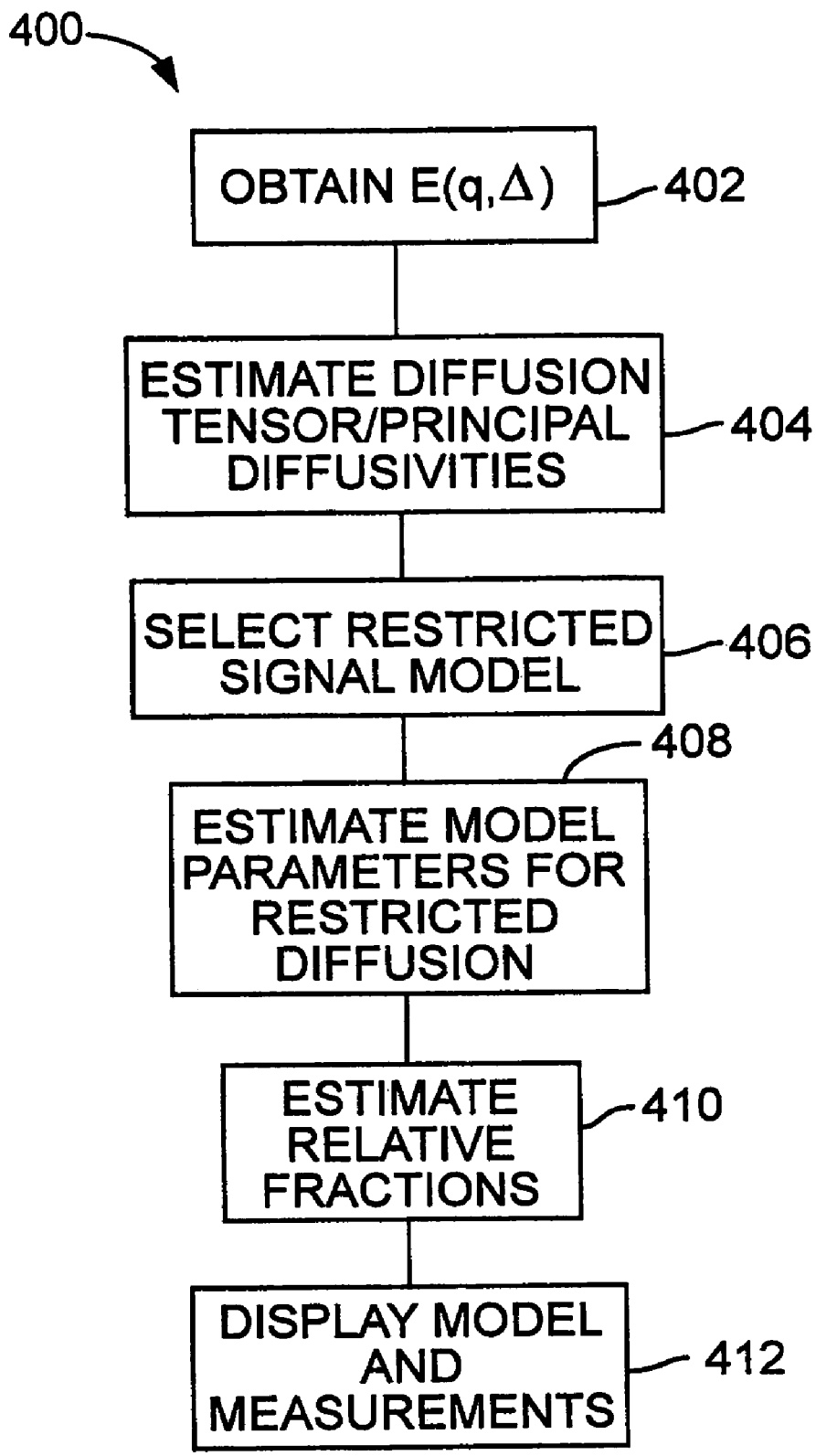
FIG. 4 is a schematic block diagram illustrating a method for modeling magnetic resonance (MR) signals and extracting model parameters associated with hindered and/or restricted spin diffusion in anisotropic specimens.

A representative method 400 is illustrated in FIG. 4. In a step 402, MR signals $E(q,\Delta)$ are obtained for variety of q-values and q-directions. Signals can be obtained by fixing a magnitude and duration of an applied pulsed-gradient magnetic field or effective magnitude of other spin-encoding magnetic field (i.e., fixing q), and varying the direction in which the encoding field is applied. After signals associated with the various directions are obtained, the q is changed and another series of signals at the various directions is obtained. Alternatively, signals can be obtained by fixing the direction of the applied encoding field and varying q. The direction of the encoding field can then be changed, and signals as a function of q can be obtained. Other signal acquisition sequences can be used.

After obtaining the MR signal $E(q,\Delta)$ for a variety of encoding field directions, model parameters associated with hindered spin diffusion are determined in a step 404. Typical model parameters determined in this step can include principal diffusivities $\lambda_{//}$, $\lambda_\perp$ and an orientation of the local axonal axis and can be based on diffusion tensor methods. A signal model for restricted diffusion perpendicular to the local axonal axis is selected in a step 406. Representative signal models include the expressions of Neumann and Callaghan described above and those described in P. van Gelderen et al., "Evaluation of restricted diffusion in cylinders. Phosphocreatine in rabbit leg muscle," J. Magn. Reson. B. 103:255-260 (1994). Model parameters associated with the selected model are obtained in step 408. Typical parameters include diffusion constants $D_{//}$ and $D_\perp$ for diffusion parallel and perpendicular to the local axonal axis and a cylinder radius. In a step 410, relative fractions of spins that exhibit hindered and restricted diffusion can be estimated. In a step 412, modeled signals can be computed and displayed with respect to measured signals, or compared with one or more baseline or control values associated with normal tissues or diseased tissues.

The method 400 of FIG. 4 shows steps performed in a specific order, but these steps can be performed in different orders, and model parameters for restricted and hindered signal components can be estimated in a common step or in a series of steps. Different models can be selected for other specimens, and the cylindrical model described herein is only a representative example.

Example Applications

Figure 5A:
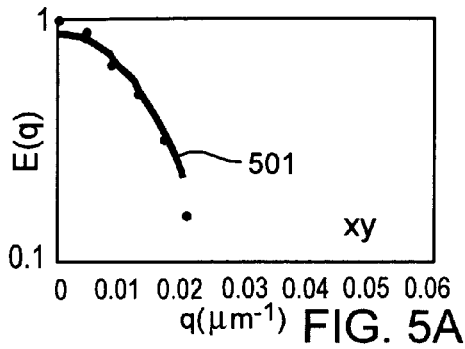
FIGS. 5A-5F are respective graphs of relative NMR signal strength obtained from human corpus callosum as a function of a magnitude of q for gradient fields applied in different directions. Measurements are indicated as data points and modeled signal strengths are shown as continuous curves. Model parameters for modeled signal strengths are f=0.60, $DH_{//}=1.1\times10^{31\ 5}$ cm$^2$/s, $\lambda_{//}=1.1\times10^{-5}$ cm$^2$/s, $\lambda_{\perp}=0.49\times10^{-5}$ cm$^2$/s, $\theta=89.9°$, and $\phi=7.8°$.
Figure 5D:
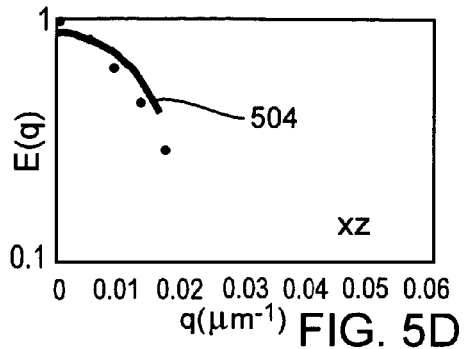
Figure 5B:
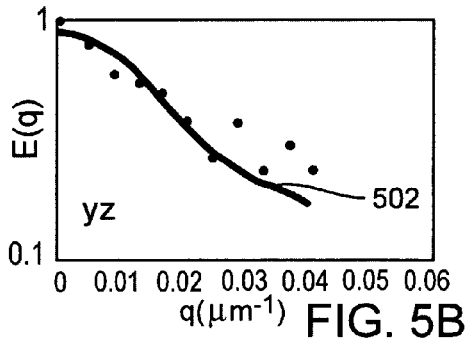
Figure 5E:
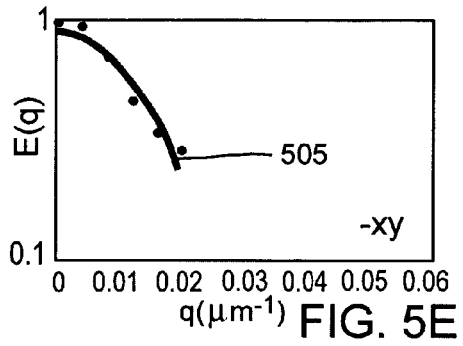
Figure 5C:
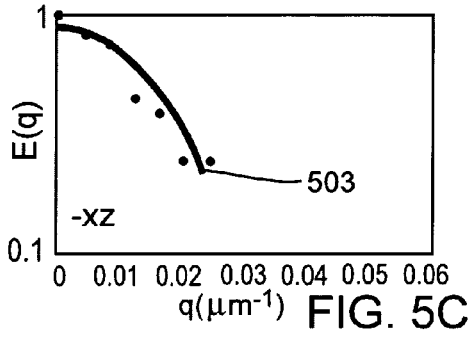
Figure 5F:
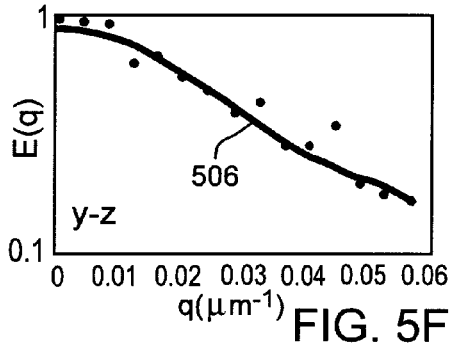
Figure 5G:
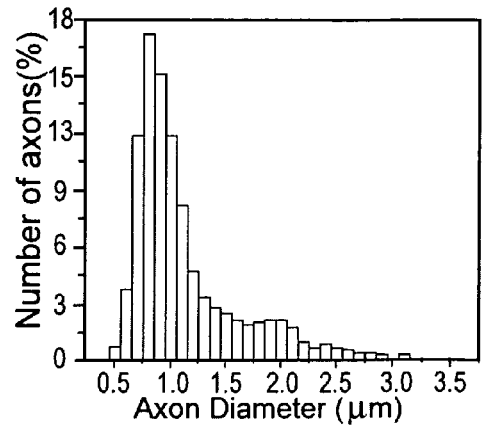
FIG. 5G is a graph illustrating a histological axon-diameter distribution used to obtain the modeled signal strengths of FIGS. 5A-5F.

FIGS. 5A-5F are respective graphs of relative MR signal strength obtained from a voxel in a corpus callosum of a healthy human subject as a function of q for gradient fields applied in different directions. Directions of the gradient fields are indicated on the figures. For example, the gradient magnetic field corresponding to FIG. 5A was applied in an xy-direction, i.e., in a direction parallel to a sum of unit vectors x and y parallel to an x-axis and a y-axis, respectively, of an xyz-coordinate system. A maximum static magnetic field was 1.5 T, and a maximum b-value was 14,000 s/mm2. The diffusion time $\Delta$ was 71 ms, and the effective duration $\delta$ of the gradient field was 65 ms. A repetition period was 2000 ms, and an echo time $T_E$ was 167 ms. Curves 501-506 are estimated signals based on model parameters as described above and using an axon-diameter distribution shown in FIG. 5G. Model parameters for modeled signal strengths are f=0.60, $D_{//}=1.1\times10^{-5}$ cm$^2$/s, $\lambda_{//}=1.1\times10^{-5}$ cm$^2$/s, $\lambda_\perp=0.49\times10^{-5}$ cm$^2$/s, f=0.6, $\theta=0.1°$, and $\phi=7.80°$, wherein the angles $\theta$ and $\phi$ are angular coordinates of the axonal axis with respect to the coordinate axis of the MRI system. Referring to FIGS. 5A-5F, the axonal axis appears to be aligned with or nearly aligned with the x-axis because gradient fields applied perpendicular to the x-axis appear to result in signals decreasing more slowly as a function of q in comparison with signal decreases associated with other directions.

Figure 6A:
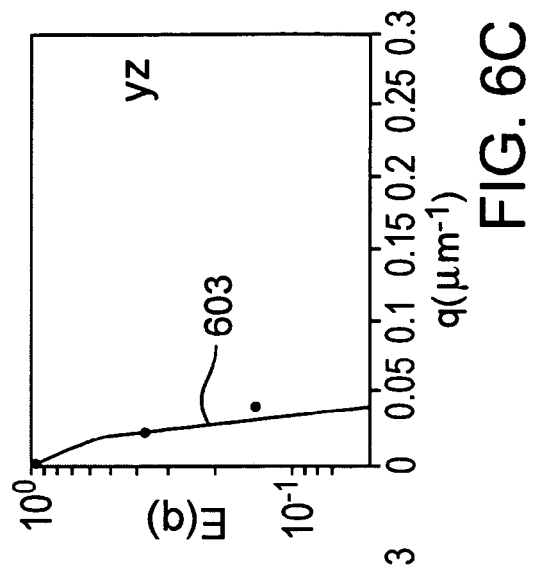
FIGS. 6A-6F are respective graphs of relative MR signal strengths obtained from rat sciatic nerve as a function of a magnitude of q for gradient fields applied in different directions. Measurements are indicated as data points and modeled signal strengths are shown as continuous curves. Model parameters for modeled signal strengths are f=0.3, $D_{//}=1.18\times10^{-5}$ cm$^2$/s, $\lambda_{//}=1.1\times10^{-5}$ cm$^2$/s, $\lambda_{\perp}=0.45\times10^{-5}$ cm$^2$/s, $\theta=3°$, and $\phi=50°$.
Figure 6B:
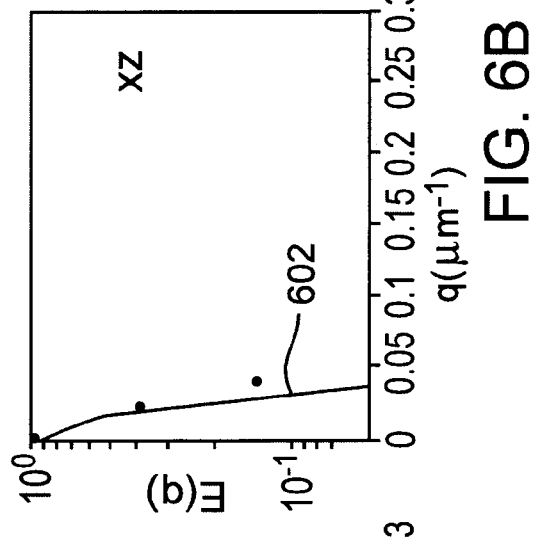
Figure 6C:
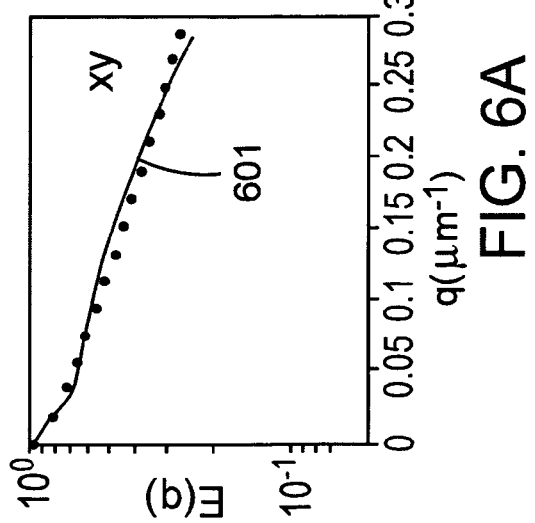
Figure 6D:
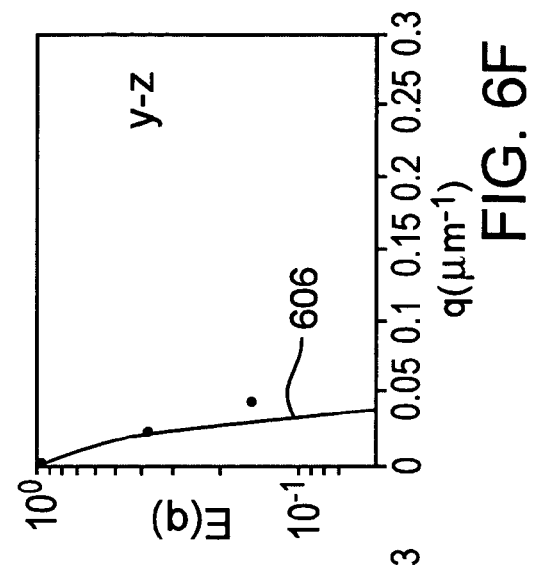
Figure 6E:
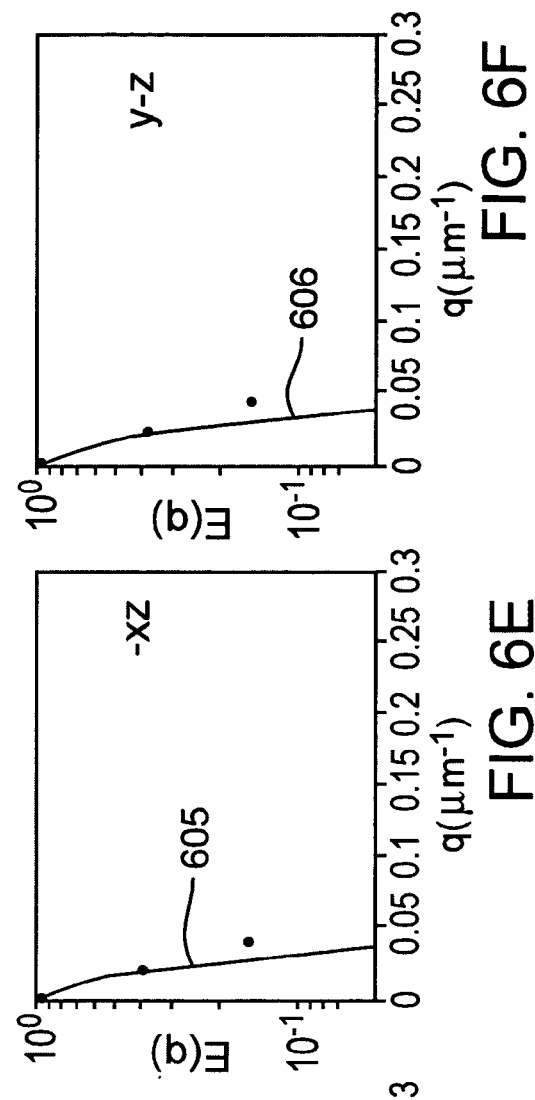
Figure 6F:
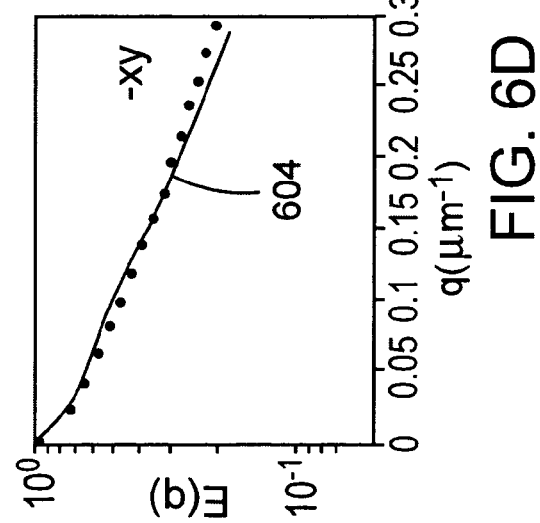

FIGS. 6A-6F are respective graphs of relative MR signal strengths obtained from rat sciatic nerve as a function of q for gradient fields applied in different directions. Directions are indicated on the figures. For example, the gradient magnetic field corresponding to FIG. 6A was applied in an xy-direction, i.e., in a direction parallel to a sum of unit vectors x and y parallel to an x-axis and a y-axis, respectively, of an xyz-coordinate system. Measurements are indicated as data points, and modeled signal strengths are shown as continuous curves 601-606 that correspond to signal estimates based on model parameters. Model parameters for modeled signal strengths are f=0.3, $D_{//}=1.18\times10^{-5}$ cm$^2$/s, $\lambda_{//}=1.1\times10^{-5}$ cm$^2$/s, $\lambda_\perp=0.45\times10^{-5}$ cm$^2$/s, $\theta=3°$, and $\phi=50°$. Reduction in signal amplitude as a function of q shown in FIGS. 6A and 6D is noticeably less than that exhibited for gradient fields applied in other directions. Curves exhibiting a rapid decay are dominated by hindered diffusion, whereas curves exhibiting slow decay are dominated by restricted diffusion. Therefore, the directions xy (x+y) and −xy (x−y) are associated with restricted diffusion.

Figure 7A:
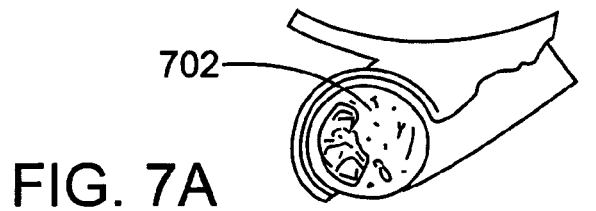
FIGS. 7A-7C are schematic diagrams illustrating respective stages in the development of a myelin sheath.
Figure 7B:
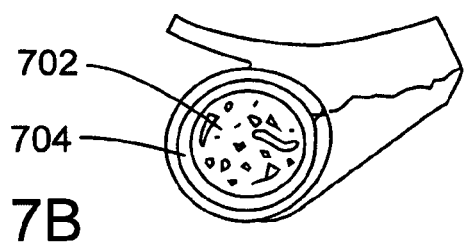
Figure 7C:
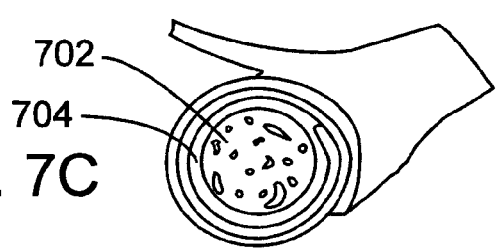

FIGS. 7A-7C illustrate an axon 702 and a surrounding myelin sheath 704 and correspond to successive respective stages in neuron development. Development of the myelin sheath 704 is apparent. With respect to a graph (not shown) of relative MR signals as a function of q for various stages of neuron development ranging from three days to ten weeks, it can be observed that signals associated with neuronal development at ten weeks decrease more slowly as a function of b than earlier developmental stages, and such signals can be associated with increases in restricted diffusion caused by neuron development and may be associated with development of the myelin sheath 704. Model parameters can be associated with neuron development. For example, abnormalities associated with properties of the myelin sheath may be identified for diagnosis and treatment.

Figure 8:
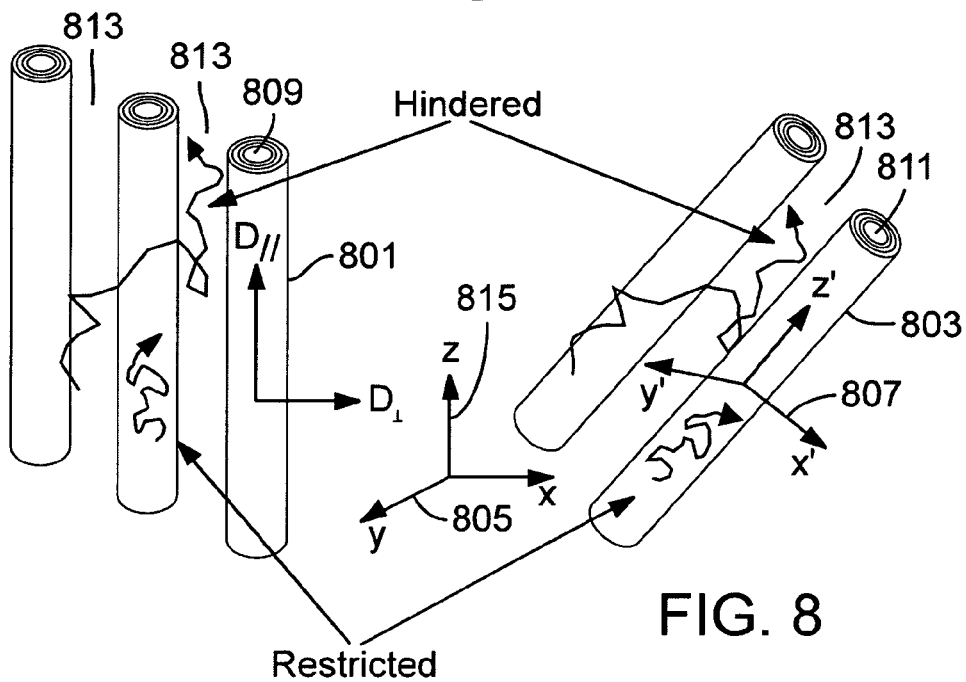
FIG. 8 illustrates a representative specimen that includes a first set and a second set of cylindrical restricted volumes aligned with respect to a first axis and a second axis, respectively.
Figure 9:
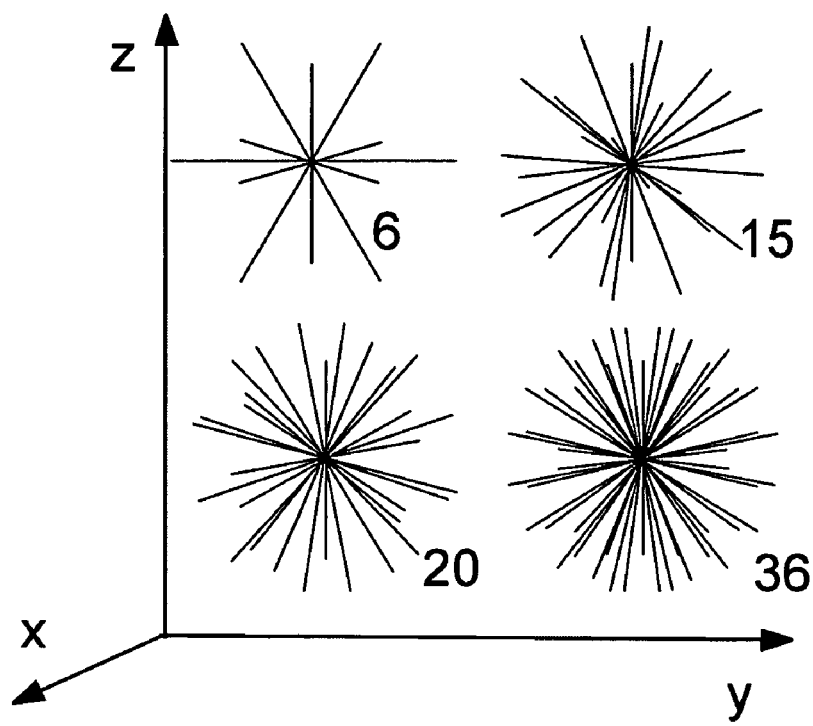
FIG. 9 illustrates representative sets of 6, 15, 20, and 36 directions along which a pulsed-field gradient ("PFG") can be applied to obtain diffusion-weighted images or signals.

In some examples, specimens include microstructures that are aligned with respect to two or more axes. With reference to FIG. 8, such a specimen includes representative neurons 801, 803 that are aligned with respect to coordinate axes 805, 807, respectively. For convenience, white matter is represented in FIG. 8 as cylindrical fibers. The coordinate axes 805, 807 are rotated with respect to each other. The rotation of the fibers 803 can be described by rotation angles ($\phi_n$ and $\theta_n$, wherein $\phi_n$ is a counter-clockwise rotation of the fibers 803 with respect to an xy-plane of the coordinate axes 805, and $\theta_n$ is a pitch from a z axis 815. A restricted component can be associated with translational diffusion from water situated in intra-axonal spaces 809, 811 while a hindered component can be associated with translational water diffusion in an extra-axonal space 813. The estimation of the fiber orientation can be done by applying pulsed-gradient magnetic fields in a plurality of directions, typically six or more directions. The orientations of the pulsed-field gradients can also be described using spherical coordinates angles $\phi_q$ and $\theta_q$. Representative sets of six, fifteen, twenty, and thirty-six pulsed-field gradient directions are illustrated in FIG. 9.

Figure 10:
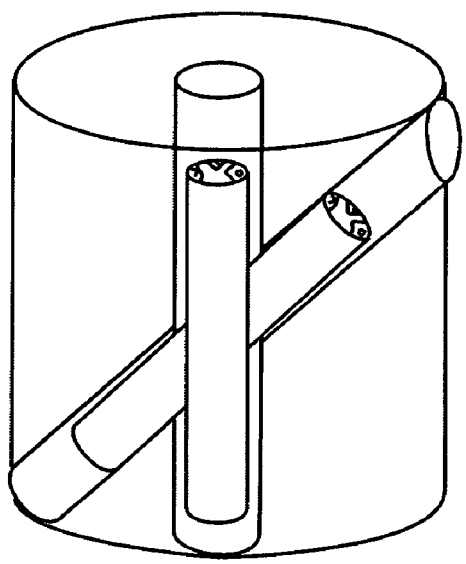
FIG. 10 illustrates a relative alignment of a first cylindrical restricted volume and a second cylindrical volume with respect to the PFG directions of FIG. 9.

Additional examples are described below. Excised spinal cords were scanned on a 7 T spectrometer equipped with a Micro2.5 gradient system (Bruker BioSpin Corp.) with a maximum gradient strength of 100 G/cm in three orthogonal directions. A spinal cord was freshly excised from a previously sacrificed pig and placed in formalin solution (4%). A section (2 cm) of cervical spinal cord was cut in half and the two pieces were placed in the apparatus as shown in FIG. 10.

Diffusion experiments were performed using a pulsed-gradient spin-echo sequence with the following parameters: TR=2000 ms, TE=200 ms, $\Delta$=150 ms, and $\delta$=40 ms. Maximum values of b and q were about 44,000 s/mm2 and 89.4/mm, respectively. The field of view (FOV) was 5 cm and the slice thickness was 15 mm to include both spinal cord crossing sections (see FIG. 10). Pulsed gradients were incremented from zero to about 5.25 G/cm in 16 equal steps and measured in 31 distinct gradient directions (see FIG. 9). The total number of images was 496 and the acquisition time per direction was about 40 minutes. The total experimental time was about 18 hours. Representative experimental data and data fits based on a single fiber (one hindered and one restricted compartment) in a region of homogeneous white matter are shown in FIGS. 24A1-24A3. In regions associated with crossing fibers, data fits are based on a two-fiber model (one hindered and two restricted compartments).

In other examples, simulated signal-decay data were produced using the models described above. The signal decay from a homogeneously oriented array of axons was produced using Eq. [1], which combines one hindered and one restricted compartment. Noise was added in quadrature as explained in Pierpaoli and Basser, "Toward a quantitative assessment of diffusion anisotropy," Magn. Reson. Med. 36:893-906 (1996). The signal decay for the two-fiber model was produced using Eq. [2] by combining two sets of hindered and restricted compartments. Input parameters for the signal-decay simulation were: population fraction of each of the compartments, alignment of the fibers in a spherical coordinates system, parallel- and perpendicular-diffusion coefficients of the hindered compartments ($\lambda_{//}$ and $\lambda_\perp$, respectively), and the parallel diffusion coefficient of the restricted component ($D_{par}$).

Figure 24B:
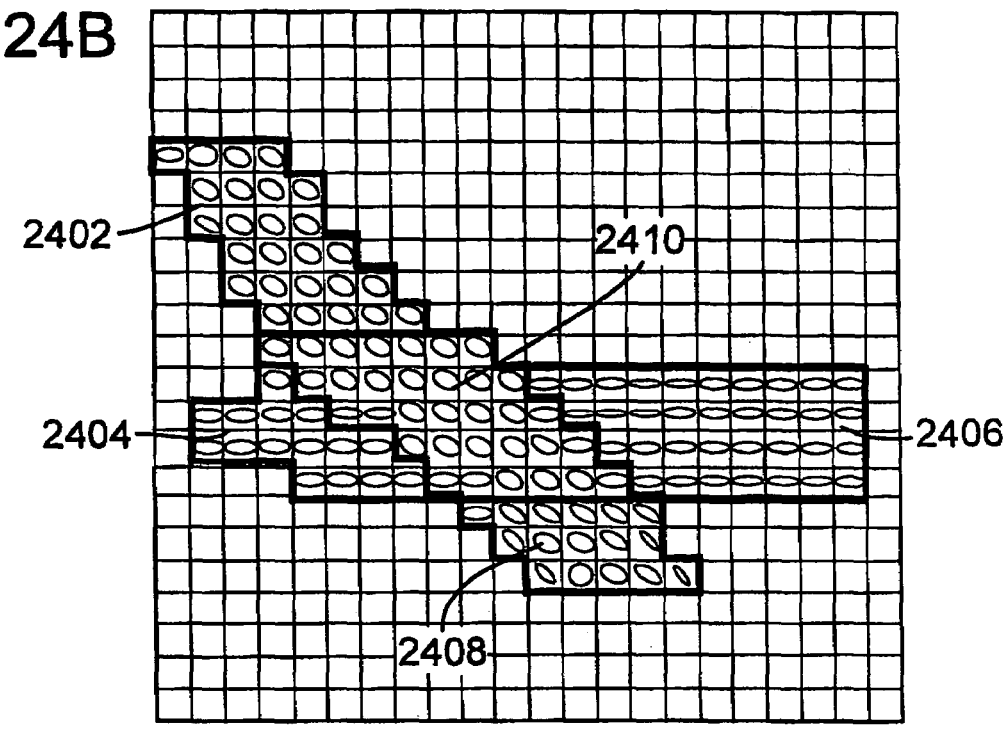
FIG. 24B depicts displacement iso-probability plots calculated for pixels in a pig spinal cord sample arranged as in FIG. 10B. Experimental data for low b-values are fit based on a single hindered compartment using conventional diffusion tensor imaging.
Figure 24C:
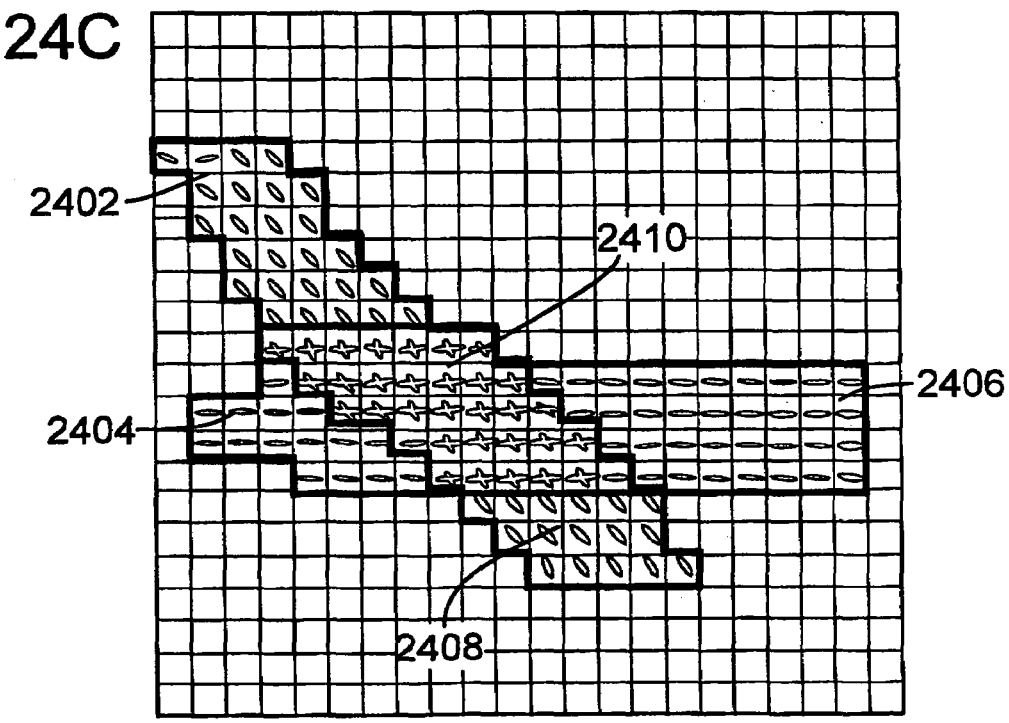
FIG. 24C depicts displacement iso-probability plots calculated for pixels in a pig spinal cord sample arranged as in FIG. 10B, wherein the plots correspond to the iso-probability plots of FIG. 24B. For pixels associated with one fiber population, the probability plots were based on both low and high b-values using a model having one hindered and one restricted compartment. For pixels associated with crossing fibers, the probability plots were based on both low and high b-values using a model having one hindered and two restricted compartments.

FIGS. 24B-24C illustrate the superior effectiveness of CHARMED-based methods to conventional diffusion-tensor imaging as applied to the pig spinal cord specimen (two spinal cord sections crossing at an angle of 45 degrees). Numerical data are included in Table 4. Referring to FIG. 24B, data fits associated with conventional diffusion-tensor imaging techniques (low b-values, one hindered compartment) show dominant fiber directions in non-overlapping regions 2402, 2404, 2406, 2408, but in a region 2410 associated with fiber overlap, the iso-probability ellipsoids fail to reveal dominant fiber directions. In contrast, CHARMED-based iso-probability plots shown in FIG. 24C, based on both low and high b-values using a model having one hindered and one restricted compartment (non-overlap regions) or two restricted compartments (fiber-crossing regions), clearly show fiber directions in all regions and clearly identify the two distinct fiber populations. As FIGS. 24B-24C show, CHARMED methods provide reliable estimates of fiber orientations even in regions where fibers cross, while a conventional DTI method typically provides only an average fiber orientation and fails to provide two-fiber orientations.

TABLE 4

CHARMED numerical data for pig spinal cord phantom. Models include 1 hindered and 1 restricted compartments (1h 1r), 1 hindered and 2 restricted (1h 2r), compartments, or 1 hindered compartment (1h). $\lambda_1 = \lambda_{par}$, and $\lambda_2$ and $\lambda_3$ represent $\lambda_{perp}$ in units of $10^5$ cm$^2$/s.

| | | | | | Crossing Pixels | | |
|---|---|---|---|---|---|---|---|
| | 45° fiber | | 90° fiber | | 1h 2r | | |
| Model | 1h 1r | 1h | 1h 1r | 1h | 45° fiber | 90° fiber | 1h |
| $f_h$ | 0.75 ± 0.05 | — | 0.63 ± 0.06 | — | 0.68 ± 0.04 | | — |
| $\lambda_1^2$ | 0.54 ± 0.15 | 0.34 ± 0.07 | 0.88 ± 0.24 | 0.44 ± 0.10 | 1.48 ± 0.10 | | 0.34 ± 0.05 |
| $\lambda_2^2$ | 0.13 ± 0.05 | 0.14 ± 0.03 | 0.19 ± 0.05 | 0.12 ± 0.03 | 0.51 ± 0.14 | | 0.13 ± 0.02 |
| $\lambda_3^2$ | 0.07 ± 0.04 | 0.10 ± 0.03 | 0.09 ± 0.03 | 0.09 ± 0.02 | 0.11 ± 0.05 | | 0.10 ± 0.02 |
| $\Phi_h$ | 80 ± 5 | 79 ± 5 | 86 ± 7 | 88 ± 6 | 10 ± 2 | | 82 ± 6 |
| $\phi_h$ | 49 ± 7 | 50 ± 7 | 87 ± 5 | 88 ± 5 | 89 ± 4 | | 74 ± 6 |
| $f_r$ | 0.21 ± 0.03 | — | 0.36 ± 0.05 | — | 0.08 ± 0.03 | 0.23 ± 0.05 | — |
| $\Phi_r$ | 77 ± 6 | — | 88 ± 5 | — | 73 ± 22 | 83 ± 6 | — |
| $\phi_r$ | 47 ± 6 | — | 92 ± 7 | — | 44 ± 11 | 104 ± 4 | — |

TABLE 4-continued

CHARMED numerical data for pig spinal cord phantom. Models include 1
hindered and 1 restricted compartments (1h 1r), 1 hindered and 2 restricted
(1h 2r), compartments, or 1 hindered compartment (1h). $\lambda_1 = \lambda_{par}$, and
$\lambda_2$ and $\lambda_3$ represent $\lambda_{perp}$ in units of $10^5$ cm$^2$/s.

| | 45° fiber | | 90° fiber | | Crossing Pixels 1h 2r | | |
|---|---|---|---|---|---|---|---|
| Model | 1h 1r | 1h | 1h 1r | 1h | 45° fiber | 90° fiber | 1h |
| Noise | 0.10 ± 0.02 | — | 0.11 ± 0.03 | — | 0.09 ± 0.04 | | — |
| FA | 0.78 ± 0.12 | 0.60 ± 0.10 | 0.80 ± 0.07 | 0.72 ± 0.09 | 0.78 ± 0.05 | | 0.58 ± 0.08 |
| N | 42 | 42 | 45 | 45 | 27 | | 27 |

FIGS. 11-23 show three-dimensional surfaces illustrating various aspects of the disclosed technology. In order to show the three-dimensional character of the surfaces, FIGS. 11-23 utilize thin contour lines. The three-dimensional surfaces can alternatively be displayed as three-dimensionally-shaded color or gray-scale surfaces.

FIGS. 11A-11D represent displacement distribution functions obtained as 3-dimensional fast Fourier transforms (FFTS) of simulated MR signals associated with a single fiber aligned 30 degrees below the x direction. The data were generated using a model with one hindered component and one restricted component with the following parameters: $f_h=0.7, f_r=0.3$, $\theta_r=\theta_h=30°$, $\phi_r=\phi_h=90°$, $\lambda_1=0.35$ μm$^2$/ms, $\lambda_2=0.8$ μm$^2$/ms, $D_{par}=1$ μm$^2$/ms, a noise floor (NF) of 0.03, and sets of 36, 20, 15, and 6 gradient directions, respectively. FIGS. 12A-12D illustrate the hindered component and FIGS. 13A-13D illustrate the restricted component. The 3-D FFT shape of the restricted component is, as expected, narrower and longer than the hindered-diffusion ellipsoid for all measured directions. Visually, no major differences are seen between the gradient schemes, and indeed all simulations provided similar numbers to real values. However, numerical analysis of the data and the simulation error shows that the error is multiplied by almost three between the 31 and 6 gradient directions schemes.

FIGS. 14A-14D represent displacement distribution functions obtained as 3-D FFTs of simulated signal decay for two fibers aligned 90 degrees with respect to each other. The data were generated using a model with one hindered component and two restricted components 90 degrees apart with the following parameters: $f_{h1}=0.35, f_{h2}=0.35, f_{r1}=0.15, f_{r2}=0.15$, $\theta_{r1}=\theta_{h1}=135°$, $\phi_{r1}=\phi_{h1}=90°$, $\theta_{r2}=\theta_{h2}=45°$, $\phi_{r2}=\phi_{h2}=90°$, $\lambda_1=0.3$ μm$^2$/ms, $\lambda_2=0.8$ μm$^2$/ms, $D_{par}=1$ μm$^2$/ms, NF=0.03, and sets of 36, 20, 15, and 6 gradient directions, respectively. In some cases, more than one set of data is generated for some directions. For example, signals associated with 36 gradient directions can include five signals associated with the z-axis so that 31 independent directions are used. A fitting procedure was performed using a combined model of two restricted components and one hindered component (FIGS. 14A-16D) or a model of only two hindered components that was sampled only in the low-q regime (FIGS. 17A-17C). FIGS. 15A-15D illustrate the hindered component and FIGS. 16A-16D illustrate the restricted component. FIGS. 17A-17C illustrate simulation results based on two hindered compartments. The combined model was able to predict with high accuracy the 3D alignment of the two fibers as well as the hindered-compartment parameters and the population ratios. However, when using the 6-direction gradient scheme, the model predicted incorrect results for both compartments. The mean error of the fitting procedure was more than ten times higher in the six directions than in the 36 directions. The two-tensor model was not able to produce the original 3-D alignment of the fibers even though the fit error was small.

FIGS. 18A-18D represent displacement distribution functions obtained as 3-D FFTs of simulated signal decay for two fibers aligned 30 degrees relative to each other. The data were generated using a model with two hindered components and two restricted components with the following parameters: $f_{h1}=0.35$, $f_{h2}=0.35, f_{r1}=0.15$, $f_{r2}=0.15$, $\theta_{r1}=\theta_{h1}=30°$, $\phi_{r1}=\phi_{h1}=90°$, $\theta_{r2}=\theta_{h2}=60°$, $\phi_{r2}=\phi_{h2}=90°$, $\lambda_1=0.3$ μm$^2$/ms, $\lambda_2=0.8$ μm$^2$/ms, $D_{par}=1$ μm$^2$/ms, NF=0.042 and sets of 36, 20, 15, and 6 gradient directions, respectively. FIGS. 19A-19D illustrate the hindered component and FIGS. 20A-20D illustrate the restricted component. Using 36 gradient directions it is possible to reproduce the 3-D alignment of the fibers. With 20 gradient directions, the error in the resolution of the fibers is increased, but is nevertheless close to original values. The 15 and 6 gradient directions produce incorrect values of the fiber direction, diffusion coefficient, and population fractions.

FIGS. 21A-21D represent displacement distribution functions obtained as 3-D FFTs of simulated signal decay for two fibers aligned 45 degrees relative to each other. The data were generated using a model with two hindered components and two restricted components with the following parameters: $f_{h1}=0.35$, $f_{h2}=0.35$, $f_{r1}=0.15$, $f_{r2}=0.15$, $\theta_{r1}=\theta h1=25°$, $\phi_{r1}=\phi_{h1}=90°$, $\theta_{r2}=\theta h2=70°$, $\phi r2=\phi h2=45°$, $\lambda_1=0.3$ μm$^2$/ms, $\lambda_2=0.8$ μm$^2$/ms, Dpar=1 μm$^2$/ms, a set of 36 gradient directions were used, and NF was 0.03, 0.09, 0.12, or 0.18. The fitting procedure was done by a combined model of two restricted components and one hindered component. FIGS. 22A-22D illustrate the hindered component and FIGS. 23A-23D illustrate the restricted component. As noise floor increases, the accuracy of the fit is reduced. With noise floor of 0.127, the 3-D alignment of the fibers as well as other fit parameters (diffusion coefficients, population fractions) tend to become unreliable.

Simulation data comparing CHARMED and conventional DTI methods are shown in Tables 1-2 for fibers oriented at 90 degrees (Table 1) and 30 degrees (Table 2). Table 1 shows that two tensor DTI methods are unable to provide fiber orientations, while CHARMED methods can provide satisfactory results if a sufficient number of gradient directions are used.

TABLE 1

Simulation values for fibers oriented at 90 degrees.

| | 1 Hindered + 2 Restricted Model | | | | | 2 Hindered (Two-tensor) | | | |
|---|---|---|---|---|---|---|---|---|---|
| | Simulation | Fitted Values | | | | Simulation | Fitted Values | | |
| # Directions | Values | 31 | 20 | 6 | # Directions | Values | 31 | 20 | 6 |
| $f_h$ | 0.7 | 0.7 | 0.68 | 0.53 | $f_{h1}$ | 0.5 | 0.49 | 0.49 | 0.64 |
| $\lambda_{//}^1$ | 0.8 | 0.55 | 0.63 | 1.06 | $f_{h2}$ | 0.5 | 0.51 | 0.51 | 0.28 |
| $\lambda_\perp^1$ | 0.3 | 0.41 | 0.42 | 0.43 | $\lambda_{//h1}^1$ | 0.8 | 0.88 | 0.79 | 0.85 |
| $f_{r1}$ | 0.15 | 0.15 | 0.14 | 0.28 | $\lambda_{\perp h1}^1$ | 0.3 | 0.50 | 0.55 | 0.33 |
| $f_{r2}$ | 0.15 | 0.15 | 0.19 | 0.13 | $\lambda_{//h2}^1$ | 0.8 | 0.50 | 0.35 | 0.27 |
| $\Phi_{r1}$ | 135 | 136 | 135 | 152 | $\lambda_{\perp h2}^1$ | 0.3 | 0.18 | 0.21 | 0.06 |
| $\phi_{r1}$ | 90 | 89 | 95 | 66 | $\Phi_{h1}$ | 135 | 72 | 2 | 164 |
| $\Phi_{r2}$ | 45 | 44 | 45 | 116 | $\phi_{h1}$ | 90 | 109 | 5 | 92 |
| $\phi_{r2}$ | 90 | 92 | 88 | 26 | $\Phi_{h2}$ | 45 | 4 | −3 | 8 |
| $D_{//}^1$ | 1 | 0.89 | 0.84 | 0.81 | $\phi_{h2}$ | 90 | 77 | 97 | 187 |
| Noise Floor | 0.03 | 0.03 | 0.024 | 0.005 | | | | | |
| Fit Error² | — | 7.58 | 12.5 | 32.8 | Fit Error | — | 18.1 | 21.5 | 25.3 |

TABLE 2

Simulation values for fibers oriented at 30 degrees.
1 Hindered + 2 Restricted Model

| | Simulation | Fitted Values | | |
|---|---|---|---|---|
| # Directions | Values | 31 | 20 | 6 |
| $f_h$ | 0.7 | 0.69 | 0.70 | 0.69 |
| $\lambda_{//}^1$ | 0.8 | 0.81 | 0.67 | 0.57 |
| $\lambda_\perp^1$ | 0.3 | 0.31 | 0.31 | 0.28 |
| $f_{r1}$ | 0.15 | 0.14 | 0.13 | 0.13 |
| $f_{r2}$ | 0.15 | 0.17 | 0.17 | 0.18 |
| $\Phi_{r1}$ | 30 | 26 | 39 | 45 |
| $\phi_{r1}$ | 90 | 89 | 91 | 77 |
| $\Phi_{r2}$ | 60 | 58 | 62 | 53 |
| $\phi_{r2}$ | 90 | 29 | 87 | 63 |
| $D_{//}^1$ | 1 | 0.85 | 1.28 | 3.00 |
| Noise Floor | 0.03 | 0.023 | 0.031 | 0.023 |
| Σ Residuals | — | 5.33 | 6.53 | 26.0 |

TABLE 3

Scan Parameters

| b-value (s/mm²) | No. of directions |
|---|---|
| 0 | 1 |
| 714 | 6 |
| 1428 | 6 |
| 2285 | 12 |
| 3214 | 12 |
| 4286 | 16 |
| 5357 | 16 |
| 6429 | 20 |
| 7500 | 20 |
| 8571 | 30 |
| 10000 | 30 |

A Gradient Scheme for Human Imaging

In general, the CHARMED methods as described above are applied to MR measurements obtained at high and low b values. In addition, because CHARMED methods provide indications of specimen structure, MR measurements to which these methods are applied are preferably associated with high angular resolution. One suitable gradient scheme for obtaining MR data suitable for CHARMED methods includes approximately ten shells of q-values. The first shells are associated with a lower angular resolution (for example, 6-12 directions) and outer shells (higher q-values) are associated with a higher angular resolution (24-31 directions).

A representative gradient sequence that can be provided with a 3T scanner is based on TR=2700 ms, TE=155 ms, Δ=53 ms, δ=47 ms, and a maximum gradient field magnitude $G_{max}$=3.4 Gauss/cm. Ten axial slices can be obtained with two averages. Field of view can be 19 cm, slice thickness to be 3 mm, and cubic resolution as (3 mm)³. A total of 169 gradient applications can be used in an acquisition time of about 6 minutes. Gradient directions and associated b-values are summarized in Table 3.

Figure 25A:
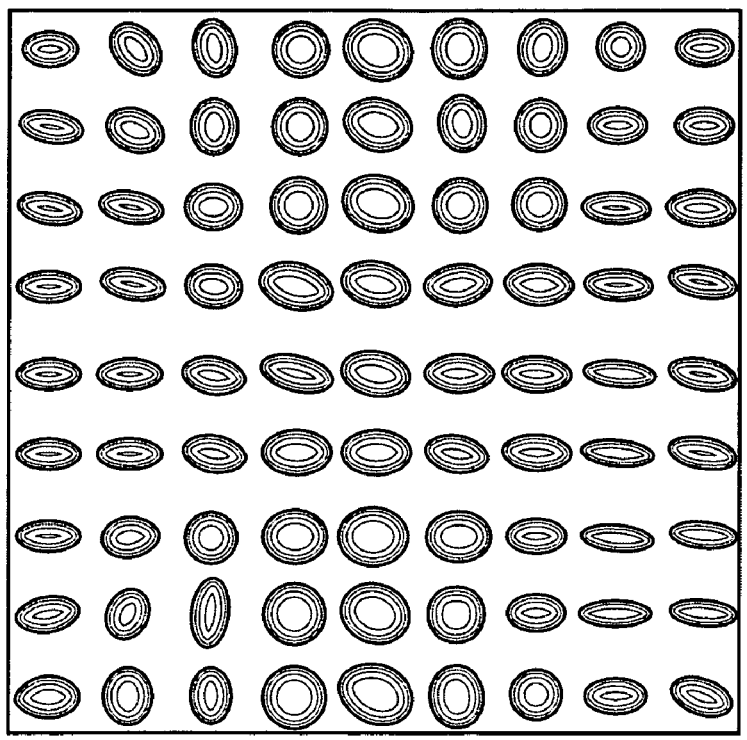
FIGS. 25A-25B illustrate iso-probability surfaces as a function of position in an image of a human brain based on conventional DT imaging, and a composite hindered and restricted method (CHARMED), respectively.
Figure 25B:
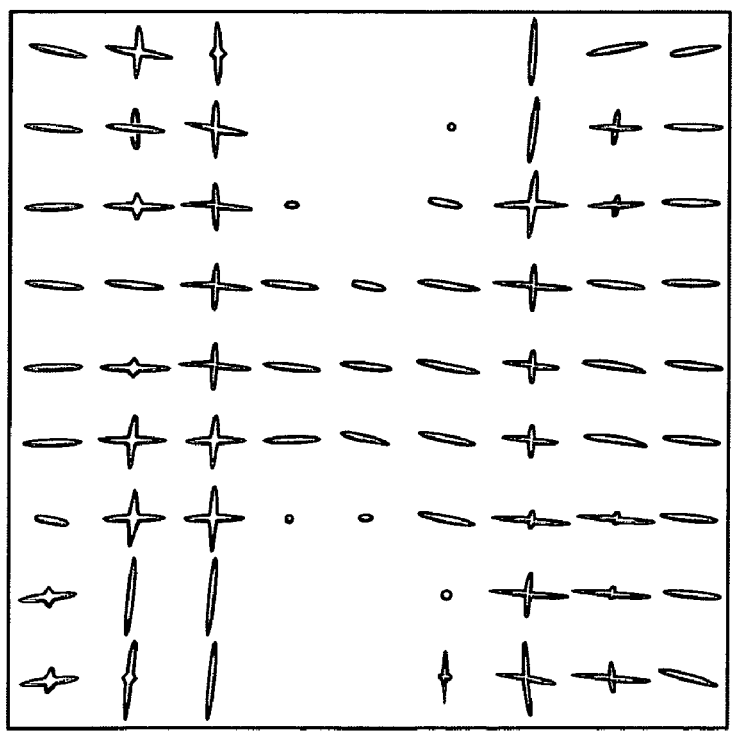

Using this set of sequences, displacement iso-probabilities at some or all image locations can be determined. FIGS. 25A-25B illustrate such iso-probability surfaces as a function of position in an image of a human brain based on conventional DT imaging, and composite hindered and restricted method (CHARMED), respectively. Referring to FIG. 25B, fiber orientation can be tracked even in regions where fibers cross. Conventional DT imaging, illustrated in FIG. 25A (based on a hindered compartment) does not permit such fiber tracking. Representative data and CHARMED data fits (one hindered compartment and one restricted compartment) can also be shown for various directions.

As shown above, signal attenuation observed at high and low q in coherent white matter can be modeled based by dividing spins into those exhibiting hindered diffusion and restricted diffusion. The hindered component can be modeled using a Gaussian distribution based on principal diffusivities that are parallel and perpendicular to an axonal axis or other axis. The restricted component can be modeled as a Gaussian distribution for diffusion parallel to the local axonal axis or other axis, and a distribution associated with restricted diffusion selected for directions perpendicular to the local axonal axis.

Evaluation of parameters associated with restricted and/or hindered diffusion can be used in the assessment of properties of various specimens. For example, estimation of a local direction associated with restricted diffusion can be used to assess local axonal orientation. Orientation of specimens of other geometries can be similarly estimated. As noted above, properties of macroscopically isotropic but microscopically anisotropic materials such as brain gray matter can be assessed. Diameter distributions of volumes having cylindrical cross-sections can be estimated, and geometric properties of other volumes associated with restricted diffusion can be estimated. For example, a distribution of distances between parallel planes that serve as diffusion boundaries can be estimated. Such distributions can be used, for example, to assess tissue degeneration or other specimen properties. For example, some diseases reduce numbers of larger or smaller diameter axons, and measurements of such distribution can be used in diagnosis and treatment.

The methods and apparatus are described with respect to parameter estimation in brain white matter, but structural evaluation as provided by these methods and apparatus can be used in numerous other applications. For example, neurodegeneration such the axon demyelination associated with multiple sclerosis can be identified. A cancer treatment can be evaluated based on diffusion changes produced in response to the treatment. The efficacy of drugs and other treatments can be evaluated based on such structural evaluations. Identification and evaluation of restricted diffusion in anisotropic specimens can also be used in neonatal screening, drug screening, food processing, and other clinical and industrial applications. In other examples, fiber connectivity, white-matter integrity, and fiber-tracking in the vicinity of brain lesions can be evaluated. The methods presented herein can be applied to the evaluation and characterization of other anisotropic specimens that exhibit hindered and restricted diffusion.

The CHARMED methods can provide estimates of population fractions in hindered and/or restricted compartments. Such fractions are typically obtained based on T2-weightings, and can differ from population fractions estimated by other methods. In addition, in white-matter MR imaging, the hindered compartment typically includes contributions from glia and astrocytes. One or more compartments can be associated with two or more, or a spectrum of T2 values. In the examples presented above, diffusion in a restricted compartment is associated with axes along which diffusion can be modeled as being statistically independent. Such modeling is appropriate for many specimens such as tubes, plates, and parallel plates. For specimens with restricted compartments having irregular, fractal, or partially reflecting boundaries, statistical independence is appropriate for motion perpendicular to and parallel to the compartment boundary in a local principal frame of reference.

CHARMED methods can also provide estimates of other diffusion-related properties such as principal diffusivities in addition to T2 or other weighted population fractions. In addition, CHARMED methods can provide specimen analysis based primarily on one or more restricted compartments, and the typically large signal contributions associated with a hindered compartment can be neglected.

Exemplary methods are described above, but these examples can be modified in arrangement and detail. For example, the effects of gradient pulses that are sufficiently long enough to permit substantial translational spin diffusion during the pulses can be included. Translational diffusion of spins in a fast-exchange limit can be modeled, and fiber-diameter distributions can be estimated. In addition, an intra-axonal axis and extra-axonal axis need not be collinear. Specimens other than nerve fiber can be evaluated, and restricted diffusion volumes having shapes other than cylindrical can be modeled. In some applications, MR signals or images include signal distortions that can be removed prior to or subsequent to modeling. In particular, for large q-values, signal distortions associated with eddy currents can be significant. Examples described above pertain to the fast- and slow-exchange limits, but in other examples partial reflection or exchange between the hindered and restricted compartments can be included. Analysis of complex specimens such as the human brain can be based on more complex selections of hindered and restricted components than the two fibers.

It will be apparent that these and other features can be modified in arrangement and detail and we claim all that is encompassed by the appended claims.

We claim:

1. A computer-implemented method for performing magnetic-resonance analysis of a sample, comprising:
    obtaining a set of translational diffusion-weighted magnetic resonance signals associated with a plurality of diffusion-weighted field strengths and a plurality of diffusion-weighted field directions;
    providing the set of translational diffusion-weighted magnetic resonance signals to a processor;
    using the processor to differentiate a signal portion in the set of signals corresponding to restricted diffusion from a signal portion in the set of signals corresponding to hindered diffusion;
    estimating at least one parameter associated with translational diffusion in a restricted compartment of the sample based on the signal portion corresponding to restricted diffusion, wherein the estimated parameter associated with the restricted compartment corresponds to at least one of an orientation of the restricted compartment, a spin fraction associated with the restricted compartment, a principal diffusivity associated with the restricted compartment, or a dimension of the restricted compartment; and
    providing the estimated parameter.

2. The method of claim 1, wherein the set of signals is a set of image signals.

3. The method of claim 1, wherein the estimated parameter associated with the restricted compartment corresponds to the orientation of the restricted compartment.

4. The method of claim 1, wherein the estimated parameter associated with the restricted compartment corresponds to the spin fraction associated with the restricted compartment of the sample.

5. The method of claim 1, wherein the estimated parameter associated with the restricted compartment is the principal diffusivity associated with the restricted compartment.

6. The method of claim 1, wherein the estimated parameter associated with the restricted compartment corresponds to the dimension of the restricted compartment.

7. The method of claim 1, further comprising estimating at least a second parameter associated with translational spin diffusion in a second restricted compartment based on the signal portion corresponding to restricted diffusion.

8. The method of claim 1, further comprising estimating at least one parameter associated with translational diffusion in a hindered compartment of the sample based on the signal portion corresponding to hindered diffusion.

9. The method of claim 8, wherein the at least one estimated parameter associated with the hindered compartment is a spin fraction associated with the hindered compartment.

10. The method of claim 9, wherein the at least one estimated parameter associated with the hindered compartment is a diffusivity associated with the hindered compartment.

11. The method of claim 1, further comprising:
associating the signal portions corresponding to restricted diffusion with diffusion in an intra-axonal volume of the sample; and
associating the signal portions corresponding to hindered diffusion with diffusion in an extra-axonal volume of the sample.

12. The method of claim 1, further comprising determining a distribution of values for the at least one estimated parameter associated with translational diffusion in the restricted compartment.

13. The method of claim 12, wherein the at least one estimated parameter is associated with a restricted compartment diameter.

14. The method of claim 13, wherein the at least one estimated parameter is associated with a restricted compartment orientation.

15. The method of claim 1, further comprising differentiating a signal portion in the set of signals corresponding to spin exchange between the restricted compartment and a hindered compartment.

16. The method of claim 1, wherein the estimated parameter is provided to a display.

17. The method of claim 16, further comprising providing an image of the specimen on the display based on the estimated parameter.

18. The method of claim 1, wherein the estimated parameter is provided to and stored on a computer readable medium.

19. A magnetic resonance apparatus, comprising:
a pulsed-gradient field controller configured to apply pulsed-gradient fields having a plurality of magnitudes in a plurality of directions;
a signal detector configured to receive and record a plurality of magnetic resonance signals associated with the applied pulsed-gradient fields; and
a processor configured to differentiate signal portions of the recorded plurality of magnetic resonance signals associated with restricted diffusion from signal portions associated with hindered diffusion and to estimate at least one parameter associated with translational diffusion in a compartment of a specimen exhibiting restricted translational diffusion and one parameter associated with translational diffusion in a compartment of the specimen exhibiting hindered diffusion based on the differentiated signal portions.

20. The apparatus of claim 19, further comprising a display configured to exhibit a diffusion distance associated with translational diffusion in the restricted compartment and in the hindered compartment.

21. The apparatus of claim 19, wherein the processor is configured to estimate an orientation of the restricted compartment based on the recorded magnetic resonance signals.

22. The apparatus of claim 19, wherein the processor is configured to estimate at least one diffusivity associated with the restricted compartment and with the hindered compartment.

23. The system of claim 19, wherein the processor is further configured to differentiate a signal portion in the set of signals corresponding to spin exchange between the restricted compartment and a hindered compartment.

24. A computer-readable medium, comprising computer-executable instructions for performing a method comprising:
obtaining a set of translational diffusion-weighted magnetic resonance signals associated with a plurality of diffusion-weighted field strengths and a plurality of diffusion-weighted field directions;
differentiating a signal portion in the set of signals corresponding to restricted diffusion from a signal portion in the set of signals corresponding to hindered diffusion;
estimating at least one parameter associated with translational diffusion in a restricted compartment of the sample based on the signal portion corresponding to restricted diffusion, wherein the estimated parameter associated with translational diffusion in the restricted compartment corresponds to at least one of an orientation of the restricted compartment, a spin fraction associated with the restricted compartment, a principal diffusivity associated with the restricted compartment, or a dimension of the restricted compartment; and
displaying the estimated parameter.

25. A method of tracking a fiber orientation, comprising:
obtaining a set of diffusion-weighted magnetic resonance signals associated with the fiber;
using a processor to differentiate signal portions in the set of signals corresponding to restricted diffusion from signal portions in the set of signals associated with hindered diffusion;
estimating a fiber orientation based on the signal portions corresponding to restricted translational diffusion; and
displaying the estimated fiber orientation on a display.

26. The method of claim 25, further comprising estimating an orientation of a second fiber relative to the first fiber based on the signal portions corresponding to restricted translational diffusion associated with the second fiber.

27. The method of claim 26, further comprising estimating an orientation of a third fiber relative to the first fiber and the second fiber based on the signal portions corresponding to restricted translational diffusion associated with the third fiber.

28. An apparatus for performing magnetic-resonance analysis of a sample, comprising:
means for obtaining a set of translational diffusion-weighted magnetic resonance signals associated with a plurality of diffusion-weighted field strengths and a plurality of diffusion- weighted field directions;
means for differentiating signal portions of the set of translational diffusion-weighted magnetic resonance signals corresponding to restricted diffusion from signal portions corresponding to hindered diffusion;
means for estimating at least one parameter associated with translational diffusion in a restricted compartment of the sample based on the signal portions corresponding to restricted diffusion; and
means for estimating at least one parameter associated with translational diffusion in a hindered compartment of the sample based on the signal portions corresponding to hindered diffusion.

29. A magnetic resonance signal apparatus, comprising:
an input device configured to receive a plurality of magnetic resonance signals;
a processor configured to differentiate signal portions associated with restricted translational diffusion in the plurality of magnetic resonance signals from signal portions associated with hindered translational diffusion and to estimate a distribution of values for at least one parameter associated with translational diffusion in a compartment of a specimen exhibiting restricted translational diffusion based on the differentiated signal portions; and
a display configured to display the distribution of values.

30. The magnetic resonance signal apparatus of claim 29, wherein the distribution of values is associated with a restricted compartment diameter distribution.

31. The magnetic resonance signal apparatus of claim 30, wherein the processor is configured to provide a comparison of the estimated distribution with a control distribution.

32. The magnetic resonance signal apparatus of claim 29, wherein the processor is configured to estimate at least one parameter associated with translational diffusion in a compartment of a specimen exhibiting hindered translational diffusion based on the plurality of magnetic resonance signals.

33. The magnetic resonance signal apparatus of claim 32, wherein the distribution of values is associated with a restricted compartment diameter distribution.

34. The magnetic resonance signal apparatus of claim 33, wherein the processor is configured to provide a comparison of the estimated distribution with a control distribution.

35. The magnetic resonance signal apparatus of claim 33, further comprising an output configured to provide a specimen assessment based on the distribution of values.

36. A computer readable medium containing computer-executable instructions for performing a method of assessing a specimen, the method comprising:
estimating at least one specimen parameter based on differentiating portions of a plurality of magnetic resonance signals associated with translational diffusion in at least one restricted compartment from portions of the plurality of magnetic resonance signals associated with translational diffusion in at least one hindered compartment, wherein the estimated parameter associated with the restricted compartment corresponds to at least one of an orientation of the restricted compartment, a spin fraction associated with the restricted compartment, a principal diffusivity associated with the restricted compartment, or a dimension of the restricted compartment; and
assessing the specimen based on the at least one estimated specimen parameter.

37. The computer-readable medium of claim 36, wherein the method further comprises determining a distribution of values for the at least one parameter, wherein the specimen is assessed based on the distribution.

38. The computer-readable medium of claim 37, wherein the at least one parameter is associated with the restricted compartment diameter.

39. The computer-readable medium of claim 38, wherein the specimen is nerve tissue and the restricted compartment diameter is an estimated axon diameter.

40. The computer-readable medium of claim 39, wherein the method further comprises assessing nerve tissue degeneration based on the distribution of values.

41. The computer-readable medium of claim 40, wherein the method further comprises associating the assessed nerve tissue degeneration with axon demyelination.

42. The computer-readable medium of claim 40, wherein the method further comprises associating the assessed nerve tissue degeneration with multiple sclerosis.

* * * * *

UNITED STATES PATENT AND TRADEMARK OFFICE
CERTIFICATE OF CORRECTION

PATENT NO. : 7,643,863 B2
APPLICATION NO. : 10/888917
DATED : January 5, 2010
INVENTOR(S) : Basser et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1573 days.

Signed and Sealed this

Sixteenth Day of November, 2010

David J. Kappos
*Director of the United States Patent and Trademark Office*